US010429520B2

(12) United States Patent
Deych et al.

(10) Patent No.: US 10,429,520 B2
(45) Date of Patent: Oct. 1, 2019

(54) DETECTION SYSTEM AND DETECTOR ARRAY INTERCONNECT ASSEMBLIES

(75) Inventors: Ruvin Deych, Gloucester, MA (US); Ben Tuval, Burlington, MA (US)

(73) Assignee: Analogic Corporation, Peabody, MA (US)

( * ) Notice: Subject to any disclaimer, the term of this patent is extended or adjusted under 35 U.S.C. 154(b) by 538 days.

(21) Appl. No.: 14/403,282

(22) PCT Filed: May 22, 2012

(86) PCT No.: PCT/US2012/039006
§ 371 (c)(1),
(2), (4) Date: Mar. 15, 2016

(87) PCT Pub. No.: WO2013/176657
PCT Pub. Date: Nov. 28, 2013

(65) Prior Publication Data
US 2016/0187498 A1    Jun. 30, 2016

(51) Int. Cl.
| G01T 1/24 | (2006.01) |
| G01T 1/20 | (2006.01) |
| H01L 27/146 | (2006.01) |
| H01L 23/498 | (2006.01) |

(52) U.S. Cl.
CPC ........ *G01T 1/2018* (2013.01); *H01L 23/4985* (2013.01); *H01L 27/1464* (2013.01); *H01L 27/14618* (2013.01); *H01L 27/14634* (2013.01); *H01L 27/14636* (2013.01); *H01L 27/14661* (2013.01); *H01L 27/14663* (2013.01); *H01L 2924/0002* (2013.01)

(58) Field of Classification Search
CPC ....... G01T 1/204; G01T 1/2045; G01T 1/202; G01T 1/178; G01T 1/2985
See application file for complete search history.

(56) References Cited

U.S. PATENT DOCUMENTS

| 6,510,195 | B1 * | 1/2003 | Chappo ................ G01T 1/2018 |
| | | | 250/208.1 |
| 2004/0120448 | A1 | 6/2004 | Ratzmann |
| 2005/0018810 | A1 | 1/2005 | Narayanaswamy et al. |
| 2007/0221858 | A1 * | 9/2007 | Abenaim .............. G01T 1/2985 |
| | | | 250/370.11 |

(Continued)

FOREIGN PATENT DOCUMENTS

| CN | 101278208 A | 10/2008 |
| JP | 2005040610 A | 2/2005 |

(Continued)

OTHER PUBLICATIONS

First Chinese Office Action cited in Chinese Application No. 201280073438.1 dated May 3, 2016, 23 pgs.
Second Chinese Office Action cited in Chinese Application No. 201280073438.1 dated Jan. 13, 2017, 18 pgs.
EP Communication cited in EP Application No. 12726286.3 dated Mar. 2, 2017, 4 pgs.

(Continued)

*Primary Examiner* — David P Porta
*Assistant Examiner* — Mamadou Faye
(74) *Attorney, Agent, or Firm* — TraskBritt

(57) ABSTRACT

The present disclosure includes multiple ways of providing photodetector interconnectivity using, for example: a) single-layered thick or thin film ceramic substrate to change a node pitch from one facing to another, and/or b) direct bonding of photodiode circuit to a flex cable interconnect.

23 Claims, 17 Drawing Sheets

(56) References Cited

U.S. PATENT DOCUMENTS

| | | | | |
|---|---|---|---|---|
| 2009/0121146 | A1* | 5/2009 | Luhta | G01T 1/2018 250/370.11 |
| 2009/0129538 | A1* | 5/2009 | Tkaczyk | A61B 6/032 378/5 |
| 2013/0327947 | A1* | 12/2013 | Ronda | G01T 1/1644 250/362 |

FOREIGN PATENT DOCUMENTS

| | | |
|---|---|---|
| JP | 200812116 A | 5/2008 |
| JP | 2009018154 | 1/2009 |
| JP | 2010278220 A | 12/2010 |
| JP | 2012057954 A | 3/2012 |
| WO | 2007039840 A2 | 4/2007 |

OTHER PUBLICATIONS

International Search Report cited in related application No. PCT/US2012/039006 dated Apr. 19, 2013, pp. 19.
Korean Office Action cited in Japanese Application No. 2015-513981 dated Jan. 26, 2016, 6 pgs.
Written Opinion of the International Searching Authority for PCT Application No. PCT/US2012/039006 dated Apr. 19, 2013, 10 pages.
EP Communication cited in EP Application No. 12726286.3 dated Jul. 5, 2018, 4 pgs.
EP Office Action dated Feb. 27, 2019 for EP Application No. 12726286, 4 pages.
Chinese First Office Action for Chinese Application No. 201710681589, dated Jan. 30, 2019, 20 pages with English Translation.

\* cited by examiner

DETECTION SYSTEM AND DETECTOR ARRAY INTERCONNECT ASSEMBLIES

CROSS-REFERENCE TO RELATED APPLICATIONS

This application is a national phase entry under 35 U.S.C. § 371 of International Patent Application PCT/US2012/039006, filed May 22, 2012, designating the United States of America and published in English as International Patent Publication WO 2013/176657 A1 on Nov. 28, 2013.

BACKGROUND

The current trend in x-ray Computed Tomography (CT) imaging is toward high-speed volume imaging, which requires that a large number of slices of image information be acquired simultaneously. Detector measurement systems (DMS) for these purposes present many challenges, as the number of channels quickly moves from ten thousand to hundreds of thousands and beyond.

The advent of high integration measurement integrated circuits (ICs), which include upwards of 64 to 256 or more channels per chip, allows the design of smaller self-contained modules that can be assembled in yet larger arrays in both the X- and the Z-directions. The challenges presented by such modules include: transferring the regular connections of the photodetector circuit array to the different connections required by the remaining components of the electronic circuitry, protecting nearby electronic components from x-ray damage, preventing the heat generated by the electronic components from affecting the detectors, and so on. Further challenges include building in the requisite mechanical accuracy, and designing a module that can easily be constructed.

CT (Computed Tomography) detectors requiring large slice counts use photodiodes with so-called back-contacts in order to overcome limitations of high density interconnects. For example, the current state-of-the-art CT detectors use a multi-layered ceramic substrate for electrically coupling the photodetectors to corresponding data acquisition electronics. Although the conventional multi-layered ceramic substrate provides interconnectivity as well as provides a change in node density from one side of the ceramic substrate to the other, it is difficult and expensive to manufacture.

BRIEF DESCRIPTION

In contrast to conventional applications, embodiments herein include multiple independent cost effective ways of providing photodetector interconnectivity. For example, a first embodiment includes use of a single-layered thick or thin-film ceramic substrate to change a node pitch from one facing to another. A second embodiment includes direct bonding of a photodiode circuit to a flexible circuit substrate.

More specifically, one embodiment herein includes an assembly. The assembly comprises a photodetector circuit and a flexible circuit substrate. The photodetector circuit such as a p-i-n (a.k.a., a PIN photodiode array) photodiode array includes an array of photodetectors disposed on a circuit substrate. Additionally, the photodetector circuit includes a first facing and a second facing. In one embodiment, each of the photodetector of the photodetector circuit includes a respective active region disposed on or near the first facing of the circuit substrate to detect optical energy. A corresponding facing of the flexible circuit substrate includes contact nodes. The second facing (opposite the first facing) of the photodetector circuit is directly bonded to the contact nodes disposed on the facing of the flexible circuit substrate.

In accordance with another embodiment, an assembly comprises a photodetector circuit, a flexible circuit substrate, and an interconnect substrate. The photodetector circuit includes an array of photodetectors disposed on a circuit substrate. A facing of the flexible circuit substrate includes an array of contact nodes. The interconnect substrate includes a first facing and a second facing. The first facing of the interconnect substrate contacts the photodetector circuit. The second facing of the interconnect substrate contacts the array of contact nodes on the flexible circuit substrate. The interconnect substrate includes conductive paths extending from the first facing to the second facing to provide interconnectivity between the array of photodetectors on the photodetector circuit and the array of contact nodes disposed on the flexible circuit substrate. In contrast to conventional applications implementing a multi-layer substrate, in one embodiment, the interconnect substrate is a single layer substrate.

In yet further embodiments, an assembly as discussed herein comprises an array of active areas of a photodetector circuit operable to detect presence of respective optical signals. Each active area of a photodetector includes at least one contact element. The assembly further includes a flexible circuit substrate having a first end including an array of surface nodes disposed thereon. A single layer of material such as an interconnect substrate provides connectivity between the array of active areas on the photodetector circuit and the array of surface nodes on the flexible circuit substrate. By way of a non-limiting example, the array of surface nodes (i.e., contact nodes) disposed on the flexible circuit substrate is more densely packed than corresponding a density of contact elements disposed on the photodetector circuit. The single layer of material (e.g., interconnect substrate) provides a respective electrically conductive path between a contact element associated with an active area in the photodetector circuit to a respective surface node of the flexible circuit substrate. In accordance with further embodiments, the single layer of material provides a change in pitch of nodes from one facing of the layer of material (e.g., interconnect substrate) to another.

Embodiments herein include methods implemented by one or more resources. A computed tomography detector includes a front-illuminated photodiode array and a flexible circuit substrate. A method as discussed herein comprises: Via a front-illuminated detection circuit, receive optical energy indicative of radiation that has traversed an examination region of interest in a computed tomography system. The front-illuminated detection circuit converts the received energy into electrical signals. The front-illuminated detection circuit transmits the electrical signals to a facing of a flexible circuit substrate. The front-illuminated detection circuit is directly bonded to a facing of the flexible circuit.

In accordance with yet further embodiments, the front-illuminated detection circuit receives the energy from a scintillator disposed in optical communication with the front-illuminated detection circuit. The front-illuminated detection circuit can be disposed between the scintillator and the flexible circuit substrate. The scintillator converts received radiation into the energy.

The front-illuminated photodetector circuit can be configured to transmit the electrical signals on multiple conductive paths fabricated on a substrate of the front-illuminated detection circuit. The multiple conductive paths can be configured to extend through the detection circuit from photodiodes detecting the energy to respective contact nodes disposed on the flexible circuit substrate.

In accordance with yet further embodiments, a respective pitch of photodiodes disposed in the front-illuminated detection circuit can be greater than a respective pitch of the contact nodes disposed on the flexible circuit substrate. The conductive paths through the detection circuit facilitate a change in pitch between the photodiodes and the respective contact nodes on the flexible circuit substrate.

The flexible circuit substrate conveys the electrical signals on the flexible circuit substrate to a remote circuit board. The flexible circuit substrate can include at least one bend greater than 45 degrees to provide connectivity between the remote circuit substrate and the photodetector circuit.

Another embodiment includes a method comprising: receiving optical energy; converting the received optical energy into electrical signals; and transmitting the electrical signals through an interconnect substrate to a flexible circuit substrate, the interconnect substrate being a single layer substrate of material disposed between the photodetector circuit and the flexible circuit substrate. The method can be implemented via a resource such as a photodetector circuit coupled to the interconnect substrate.

The interconnect substrate conveys the electrical signals in the interconnect substrate on conductive paths extending from a first facing of the interconnect substrate to a second facing of the interconnect substrate. In such an embodiment, the conductive paths provide interconnectivity between an array of photodetectors that receives the optical energy and an array of contact nodes disposed on the flexible circuit substrate.

In accordance with yet another embodiment, the interconnect substrate conveys the electrical signals on portions of substantially orthogonal electrically conductive paths extending through the single layer substrate from the first facing to the second facing.

In accordance with another embodiment, the photodetector circuit receives the optical energy from a scintillator device. The scintillator device can be disposed adjacent to the photodetector circuit. The photodetector circuit receiving the optical energy can be sandwiched between the scintillator and the interconnect substrate.

In yet further embodiments, the photodetector circuit or optical detector circuit transmits the electrical signals through at least one layer of conductive paths disposed on a surface of the interconnect substrate. The at least one layer of conductive paths electrically couple the photodetector circuit to the flexible circuit substrate.

Further embodiments herein include a photodetector circuit (e.g., optical detector circuit) that transmits the electrical signals on conductive paths disposed in the interconnect substrate. A respective spatial density of first terminal ends of the conductive paths per unit of area on a first facing of the interconnect substrate is less than a spatial density of second terminal ends of the conductive paths per unit of area on a second facing. The second facing of the interconnect substrate can be coupled directly to the flexible circuit substrate.

In accordance with one embodiment, the photodetector circuit is a back-illuminated photodetector circuit. The back-illuminated photodetector circuit receives the optical energy and subsequently transmits the electrical signals from the back-illuminated photodetector circuit through the interconnect substrate to the flexible circuit substrate.

These and other more specific embodiments are disclosed in more detail below.

As discussed herein, techniques herein are well suited for use in applications such as photodetector applications. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations, elements, aspects, etc.) of the invention(s), the reader is directed to the textual Detailed Description section and corresponding figures of the present disclosure as further discussed below. The following Detailed Description, in addition to providing an intricate description of details of the invention, also provides a further summary of aspects of the invention or inventions.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

The use of conventional multi-layered interconnect substrates increases the cost of CT detectors and in general reduces their reliability, because of possibility of open connections in multiple conductive layers. The CT detector contributes significantly to the cost of CT scanners, and detector failures due to failed interconnections may contribute significantly to down time of medical or security CT scanners.

As previously discussed, embodiments herein include a novel detector assembly using more economical and reliable single layer substrate with thick or thin film contacts. Another embodiment herein includes direct bonding of the back-contact photodetector to flex cable, completely eliminating the use of substrate.

Figure 1:
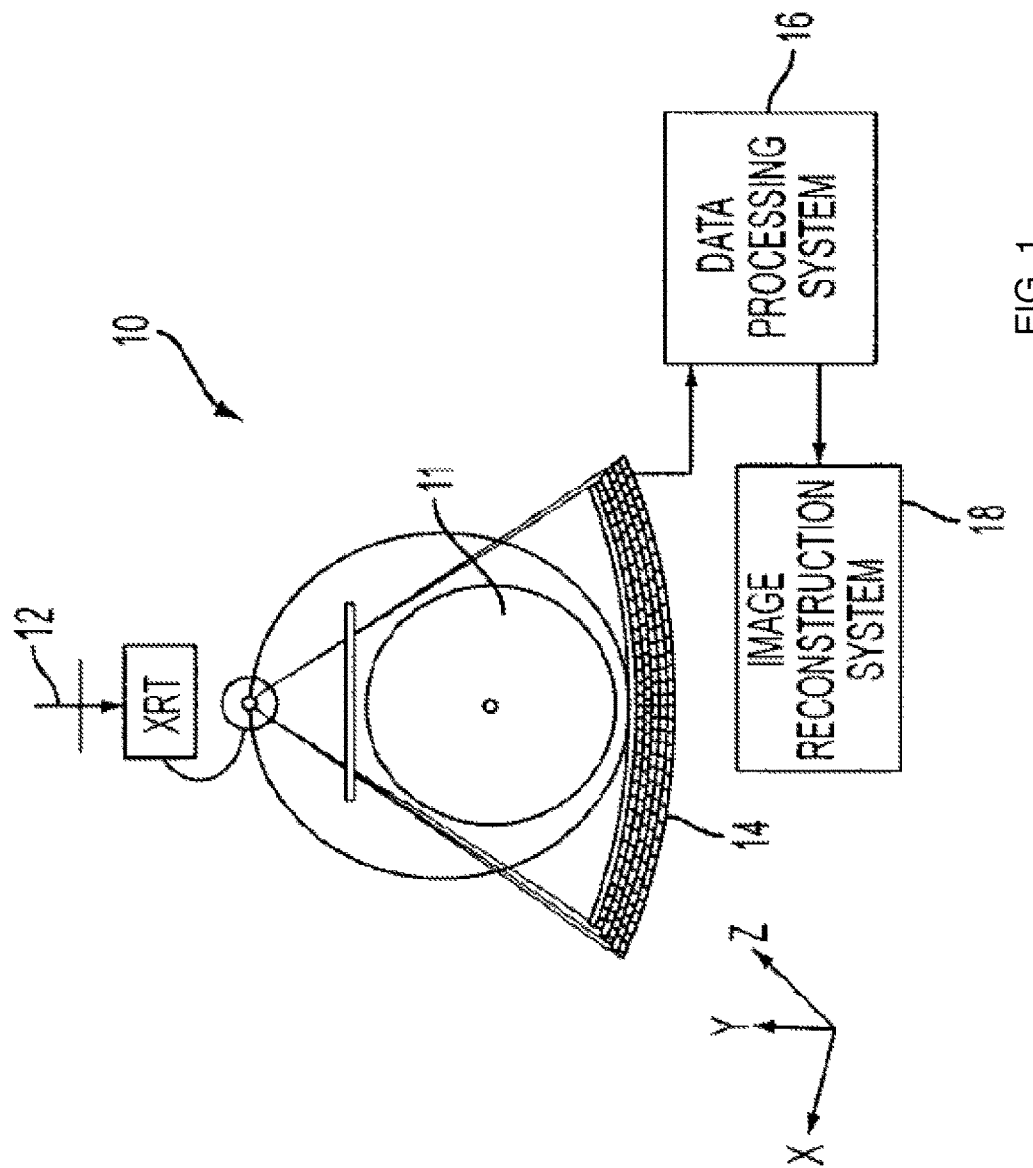
FIG. 1 is an example diagram of a conventional multi-row detector array used in a CT imaging system according to conventional techniques.

FIG. 1 is a schematic functional diagram of a conventional multi-row detector array for a CT imaging system 10. A CT imaging system 10 allows an image of the internal structure of a target object 11 to be generated, one cross-sectional slice at a time, or in helical mode of data acquisition by irradiating the slices of the target object 11 with radiation such as X-rays, from one or more directions.

In overview, the CT imaging system 10 includes an X-ray source 12, a multi-row X-ray detector array 14, a signal acquisition system 16, and an image reconstruction system 18. The X-ray source 12 generates X-rays which pass through the target object 11, which may typically be an anatomical region of a patient. In other words, the X-ray radiation traverses an examination region of interest of a computed tomography system such as target object 11.

The X-ray detector array 14 (i.e., array of photodetectors, optical detector circuit, etc.) detects X-rays that have passed through the target object 11, and generates detection signals indicative of the attenuated intensities of the X-rays that have traversed an examination region including the target object 11. In one embodiment, the X-rays traverse the examination region of a computed tomography apparatus (e.g., CT imaging system 10).

The signal acquisition system 16 digitizes and processes these detection signals. The processed signals are then sent to the image reconstruction system 18, which implements image processing techniques to reconstruct a tomographic image of the target object 11.

The X-ray source 12 may be a conventional X-ray tube (XRT), for example. The X-ray source 12 generates X-rays from a focal spot of the XRT. These X-rays are typically collimated before the X-rays irradiate the target object 11. The X-ray detector array 14 is an array of individual X-ray detector elements, for example solid-state detectors consisting of scintillators and photodetectors.

When photodetectors are used, the X-rays that have traversed the target object 11 first interact with scintillators, which convert the incident X-rays into visible light. The photodetectors receive the visible light generated by the scintillators, and generate electrical signals responsive to the visible light received from the scintillators. X-ray detector elements other than scintillators and photodetectors may also be used in different embodiments of the present disclosure. Typically, the photodetectors are photodiodes.

Note that embodiments herein are not limited to medical applications. That is, the techniques as discussed herein can be applied to any application configured to analyze objects using radiation.

Figure 2:
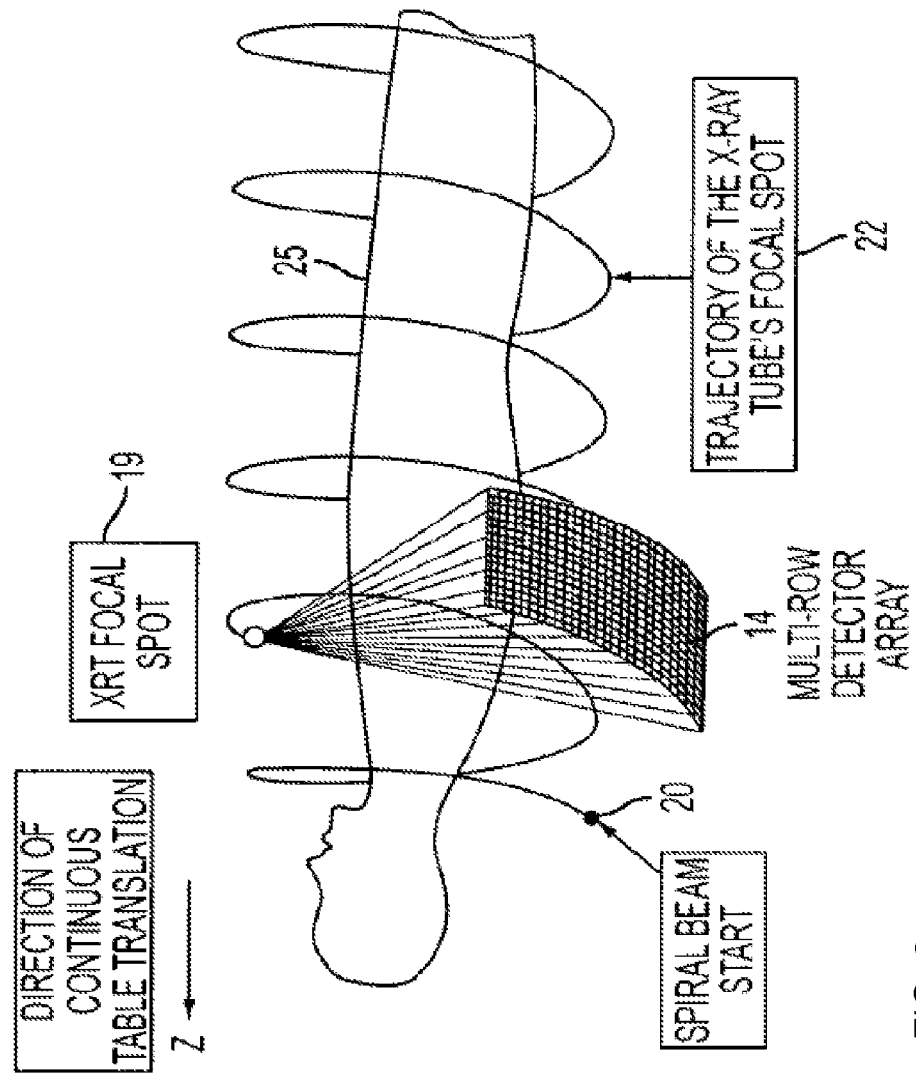
FIG. 2 is a schematic functional diagram of a helical CT scanner according to conventional techniques.

FIG. 2 is a schematic functional diagram of a helical CT scanner according to conventional techniques.

In a helical CT scanner, the patient 25 is translated (typically at a constant speed), while the X-ray source and the X-ray detector array 14 rotate around the patient. As the patient is moving, the data for a prescribed number of axial slices of the target object is acquired. As seen in FIG. 2, the trajectory 22 of the X-ray tube focal spot 19 maps out a helix.

In FIGS. 1 and 2, the z-axis indicates the axial direction along which the multiple slices of the target object 11 are taken, while the x-axis is one of the coordinates of the plane in which the array of X-ray detector elements are disposed. As seen from FIGS. 1 and 2, a conventional multi-row detector array has x-ray detector elements that are modularized along the x-direction. Typically, a module may include 16, 24, 32 or more pixels, and 2 or more dozen modules may be contained per arc.

When the number of slices in CT systems is on the order of 16, 32, 64, etc., modularity in the z-direction may not be necessary. As the number of slices approaches several hundred, however, with four or five thousand pixels per module, modularizing along the z-direction as well as along the x-direction may be required.

Figure 3:
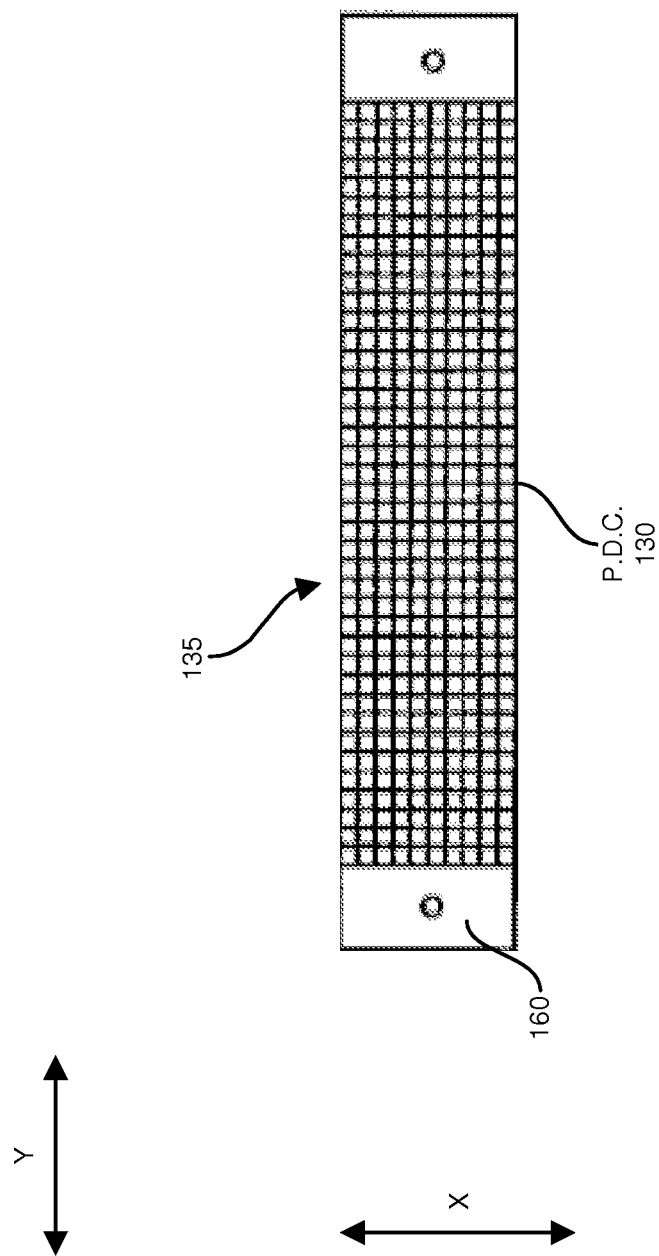
FIG. 3 is an example diagram illustrating a multi-row DMS array that is modular in both the X- and the Z-directions according to conventional techniques.

FIG. 3 illustrates an array of multiple photodetector circuits according to conventional techniques. As discussed above, each of the photodetectors 135 disposed on the photodetector circuit 130 detects a presence of radiation in a corresponding region of coverage. In this front view diagram, the bracket 160 resides behind the photodetector circuit 130 and provides support to corresponding processing circuitry as will be discussed later in this specification.

In one embodiment, the photodetector circuit 130 includes a planar array of multiple semiconductor chips disposed in the x and/or y direction to form a sufficiently large array of photodetectors 135.

As an alternative to using multiple chips to form an array of photodetectors, the photodetector circuit 130 can be a single semiconductor chip including the multiple photodetectors 135.

Note that multiple arrays of photodetector arrays can be mounted side by side to provide a large area of detector coverage as shown by the X-ray detector array 14 in FIG. 1.

Figure 4:
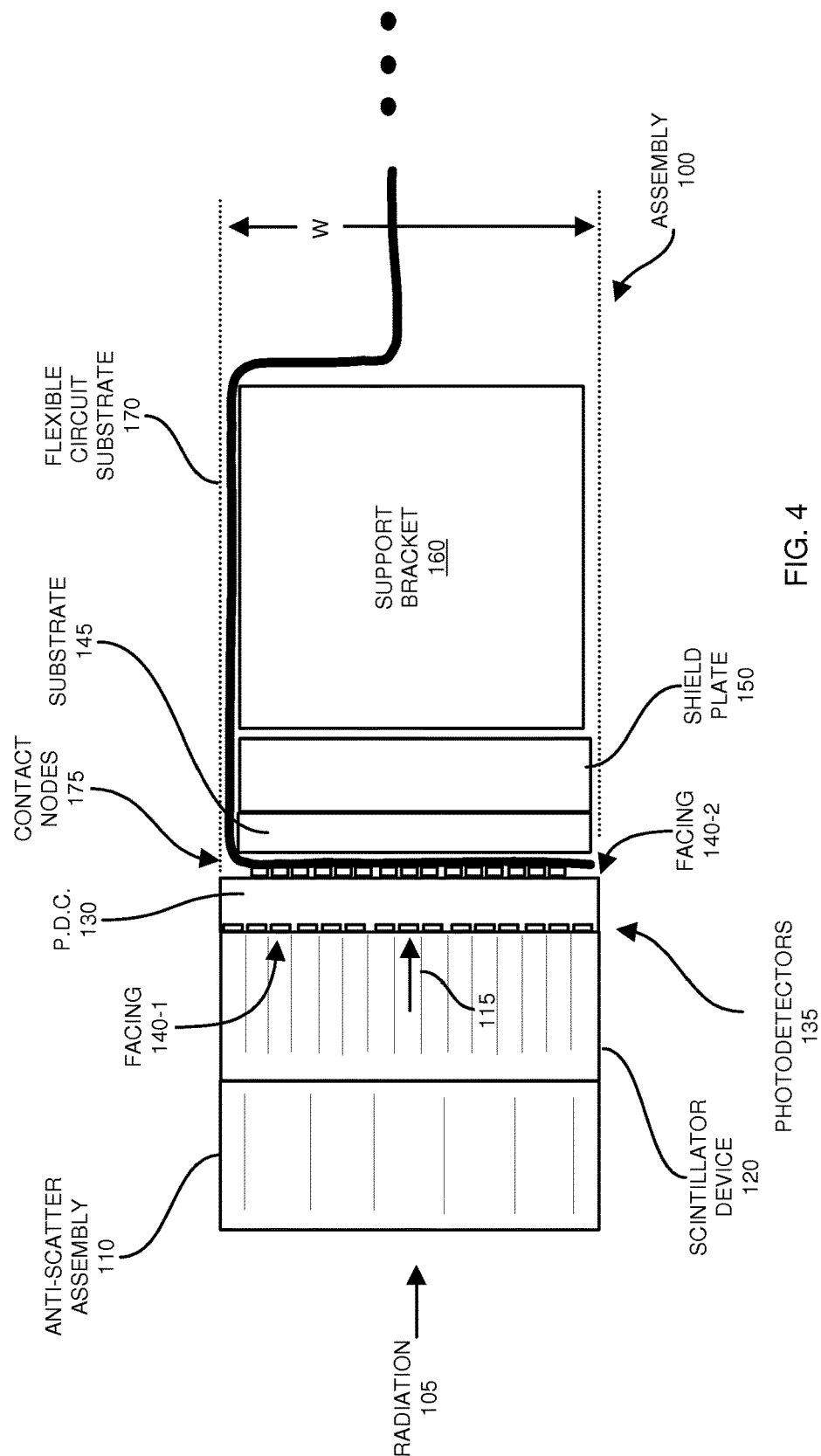
FIG. 4 is an example diagram illustrating a cross-sectional view of a photodetector assembly including an optical detector circuit according to embodiments herein.

FIG. 4 is an example diagram illustrating a cross-sectional view of a photodetector assembly according to embodiments herein.

As shown, photodetector assembly 100 includes anti-scatter assembly 110 that receives radiation 105. In one embodiment, the anti-scatter assembly 110 reduces the amount of scattered radiation received by scintillator device 120.

At least a portion of the radiation 105 passing through the anti-scatter assembly 110 is received by scintillator array. The scintillator device 120 converts received radiation 105 into a respective optical signal 115 detected by an optical detector circuit such as photodetectors 135. By way of a non-limiting example, the scintillator device 120 is disposed adjacent to and in contact with the first facing 140-1 of the photodetector circuit 130. The photodetector circuit 130 is sandwiched between the scintillator device 120 and the flexible circuit substrate 170.

In this non-limiting example, facing 140-1 of photodetector circuit 130 includes photodetectors 135. The photodetector circuit 130 can include an array of so-called front illuminated photodetectors. For example, the photodetector circuit 130 can include an array of photodetectors 135 disposed on a corresponding circuit substrate such as a semiconductor device.

The photodetector circuit 130 includes a first facing 140-1 and a second facing 140-2. In one embodiment, the photodetector circuit 130 is a front-illuminated detector circuit.

Each of the photodetectors 135 of the photodetector circuit 130 have a respective active region disposed and/or formed on or near the first facing 140-1 of photodetector circuit 130 in which to detect a presence of optical energy produced by the scintillator device 120. By way of a non-limiting example, each of the photodetectors 135 of the photodetector circuit 130 receives at least a portion of the optical energy through the facing 140-1. Thus, the photodetectors 135 can be front-illuminated photodetectors.

Based on a received optical signal 115, each of the photodetectors 135 produces a corresponding electrical signal representative of a degree to which the photodetector detects the presence of radiation in a respective area of coverage.

The flexible circuit substrate 170 includes contact nodes 175 on a respective facing in contact with the facing 140-2 of the photodetector circuit 130. In one embodiment, the second facing 140-2 of the photodetector circuit 130 (and/or nodes thereon) is directly bonded to the contact nodes 175 disposed on the facing of the flexible circuit substrate 170. A suitable material such as solder may provide connectivity between a respective contact node 175 on the flexible circuit substrate and a corresponding node disposed on facing 140-2 of the photodetector circuit 130.

Conductive paths extending from photodetectors 135 on facing 140-1 through the photodetector circuit 130 carry the respective electrical signals produced by photodetectors 135 to contact nodes 175 of the flexible circuit substrate 170. Flexible circuit substrate 170, in turn, conveys the electrical signals (as produced by the respective photodetectors 135) to remotely located image processing circuitry that reproduces an image based on the electrical signals produced by photodetectors 135 in the photodetector circuit 130.

As mentioned, in one embodiment, each of the photodetectors 135 disposed on the photodetector circuit 130 includes an active region in which to detect received optical energy from scintillator device 120. In one non-limiting example, each respective active region is a doped region including an impurity diffused through the first facing 140-1 during fabrication of the photodetector circuit 130. Detection of an optical signal via the active region (disposed on and/or near the first facing 140-1 of the photodetector circuit 130) results in generation of a corresponding electrical signal indicating a degree to which radiation is present in the corresponding region of coverage.

In one embodiment, the flexible circuit substrate 170 is any suitable thickness such as 0.2 millimeter thick.

Figure 5:
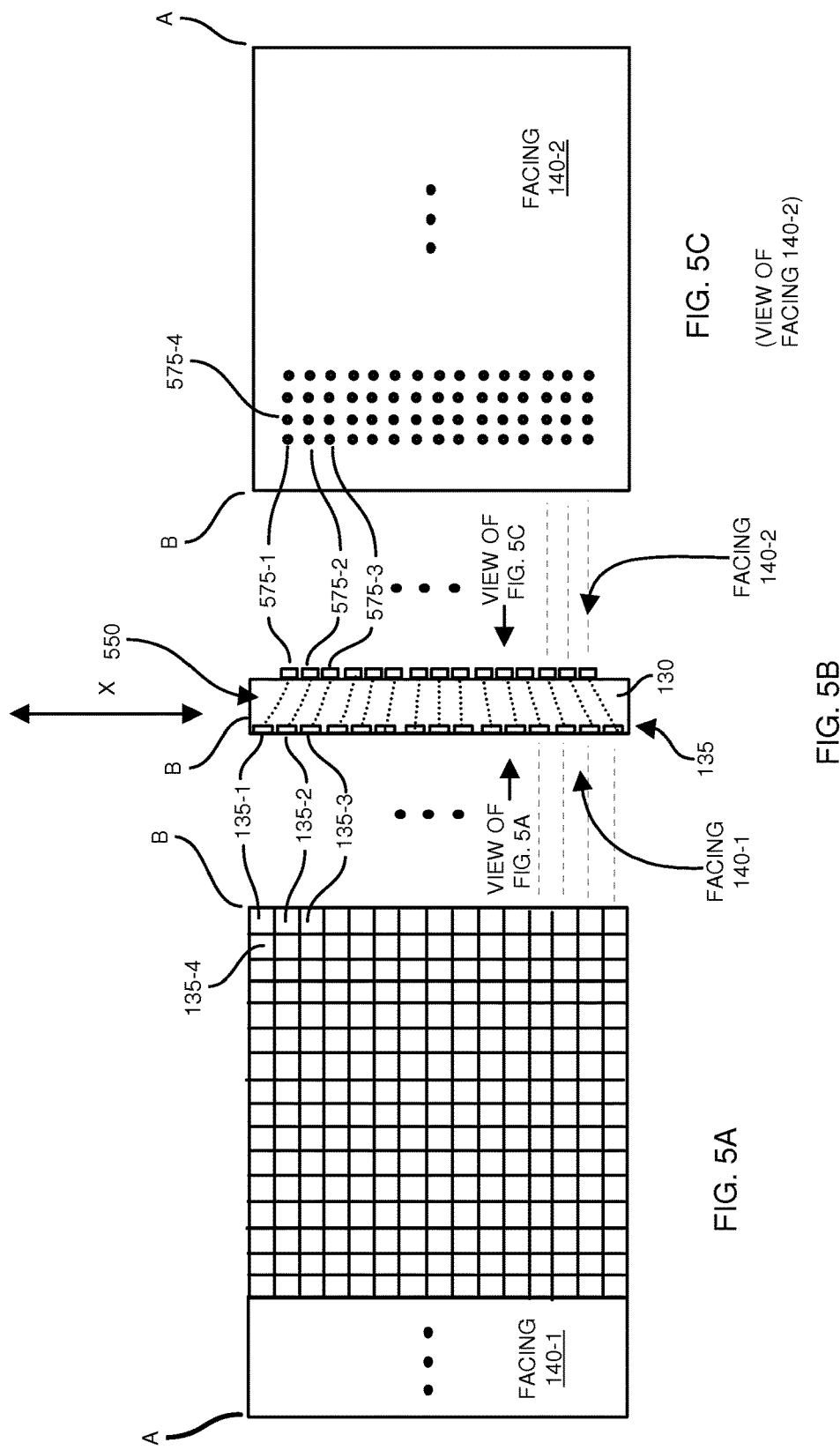
FIG. 5A is an example diagram illustrating a view of a first facing of a photodetector circuit according to embodiments herein.
FIG. 5B is an example diagram illustrating a cross-sectional view of a photodetector circuit according to embodiments herein.
FIG. 5C is an example diagram illustrating a view of a second facing associated with a photodetector circuit according to embodiments herein.

FIG. 5B is an example diagram illustrating a side view of the photodetector circuit according to embodiments herein.

As shown, the facing 140-1 of circuit substrate (e.g., photodetector circuit 130) on which the photodetectors 135 reside can include multiple conductive paths 550 extending through the circuit substrate from the first facing 140-1 to the second facing 140-2. For example, the conductive paths 550 through the photodetector circuit 130 provide electrical connectivity between photodetector contact elements disposed on or near the first facing 140-1 and contact nodes 175 disposed on the flexible circuit substrate 170.

More specifically, photodetector circuit 130 includes photodetector 135-1, photodetector 135-2, photodetector 135-3, photodetector 135-4, etc., as shown in front view of FIG. 5A.

Each photodetector 135 disposed on facing 140-1 can include one or more contact nodes (also on or near facing 140-1) that are electrically connected to respective contact nodes 575 (e.g., photodiode contact nodes) on facing 140-2 via a respective conductive path 550.

FIG. 5C illustrates a view of contact nodes 575 disposed on facing 140-2 of photodetector circuit 130. Each photodetector 135 disposed on facing 140-1 of photodetector circuit 130 includes one or more circuit nodes from which to output an electrical signal.

As previously discussed, the conductive paths 550 through the photodetector circuit 130 provide connectivity of the one or more circuit nodes on facing 140-1 to contact nodes 575 disposed on facing 140-2 of photodetector circuit 130. For example, as shown, a first conductive path of conductive paths 550 provides connectivity from a node of photodetector 135-1 on facing 140-1 to contact node 575-1 disposed on facing 140-2; a second conductive path of conductive paths 550 provides connectivity from photodetector 135-2 on facing 140-1 to contact node 575-2 disposed on facing 140-2; a third conductive path of conductive paths 550 provides connectivity from photodetector 135-3 on facing 140-1 to contact node 575-3; a fourth conductive path of conductive paths 550 provides connectivity from photodetector 135-4 on facing 140-1 to contact node 575-4 disposed on facing 140-2; and so on. Accordingly, via the conductive paths 550 through the photodetector circuit 130, the node associated with the photodetectors 135 of photodetector circuit 130 are accessible from facing 140-2.

As shown, the nodes of photodetectors (e.g., one node per photodetector) on facing 140-1 are more densely packed than corresponding contact nodes 575 associated with photodetectors 135 on facing 140-2. Accordingly, facing 140-2 can include a pattern of nodes associated with the photodetectors 135 that are reduced compared to a respective smaller pattern of contact nodes 575 disposed on facing 140-2.

Thus, in one non-limiting example, a respective spacing between adjacent output contact elements associated with the photodetectors 135 on the first facing 140-1 is greater than a respective spacing between corresponding contact nodes 575 disposed on a facing of 140-2 of the photodetector circuit 130.

Note that the pattern of contact nodes 575 on the facing 140-2 can be configured to substantially match the pattern of contact nodes 175 on the flexible circuit substrate 170. Via shoulder or other suitable joints, the contact nodes 575 can be electrically and fixedly coupled to the respective contact nodes 175 on the flexible circuit substrate 170. In accordance with such embodiments, the conductive paths 550 and configuration of the photodetector circuit 130 facilitates a change in pitch between the photodetectors 135 on facing 140-1 and the corresponding contact nodes 175 on the flexible circuit substrate 170.

As shown, the conductive paths 550 can be configured to extend through the photodetector circuit 130 in any suitable manner. In one non-limiting example, at least a portion of each conductive path 550 can be configured to extend substantially perpendicular from the facing 140-1 to the facing 140-2 to accommodate the change in pitch from facing 140-1 to facing 140-2 as discussed above. Additionally, a portion of each of one or more of the conductive paths 550 can be disposed in parallel or substantially in a plane of facing 140-1 and/or facing 140-2 to provide a fan-in or fan-out. Thus, a first portion of a respective conductive path can extend substantially in a plane of facing 140-1 and/or facing 140-2. A second portion of a respective conductive path can extend substantially orthogonal through the photodetector circuit 130 from facing 140-1 and facing 140-2. Accordingly, one embodiment herein includes a photodetector circuit 130 configured to include nodes on a back-side (i.e., facing 140-2) that are more densely packed than corresponding nodes of photodetectors 135 disposed on a front-side (i.e., facing 140-1).

Figure 6:
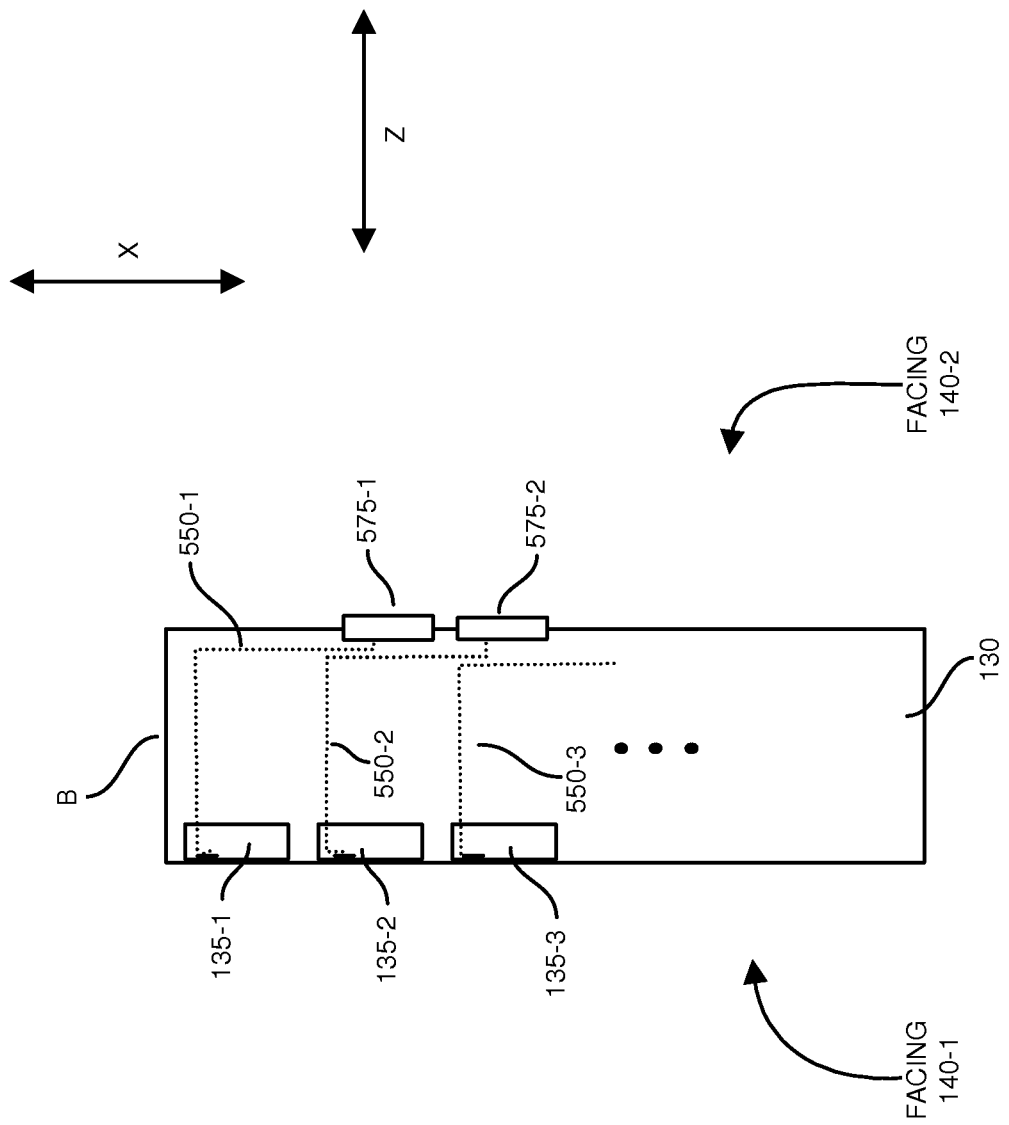
FIG. 6 is an example side view diagram of a photodetector circuit according to embodiments herein.

FIG. 6 is an example diagram illustrating a photodetector circuit according to embodiments herein.

As shown, conductive path 550-1 provides an electrical connection from a node of photodetector 135-1 (such as a front-illuminated photodetector) to corresponding contact node 575-1 disposed on or adjacent to facing 140-2. The conductive path 550-1 can include multiple portions along different axis. For example, at least one portion of the conductive path 550-1 extends orthogonal with respect to a plane of facings 140-1 and 140-2 (e.g., substantially parallel to the z-axis) through the substrate of photodetector circuit 130. One or more other portions of the conductive path 550-1 can extend in the x-axis and/or y-axis as well to provide connectivity.

In one embodiment, the optical signal 115 detected by the photodetector 135-1 produces a corresponding charge value in an active region of the photodetector 135-1. The charge is carried as output current from the active area of the corresponding photodetector through conductive path 550-1 to contact node 575-1. The output current is proportional to the number of light photons received. Thus, upon detection of an optical signal, the photodetector 135-1 outputs an electrical signal over conductive path 550-1 to contact node 575-1.

In accordance with further embodiments, remotely located processing circuitry converts the electrical signal (conveyed over the conductive path 550-1) into a digital value indicative of the amount of radiation 105 received in the region monitored by the photodetector 135-1.

In a similar manner, conductive path 550-2 provides an electrical connection from a node of photodetector 135-2 to corresponding contact node 575-2 disposed on or adjacent to facing 140-2. For example, the conductive path 550-2 also can include multiple segments disposed in one or more axis to provide the connectivity between the photodetector 135-2 and the contact node 575-2. Upon detection of an optical signal in an active region of the photodetector 135-2, the photodetector 135-2 outputs an electrical signal over conductive path 550-2 to contact node 575-2.

Each of the photodetectors 135 can be configured to operate in a similar manner.

Figure 7:
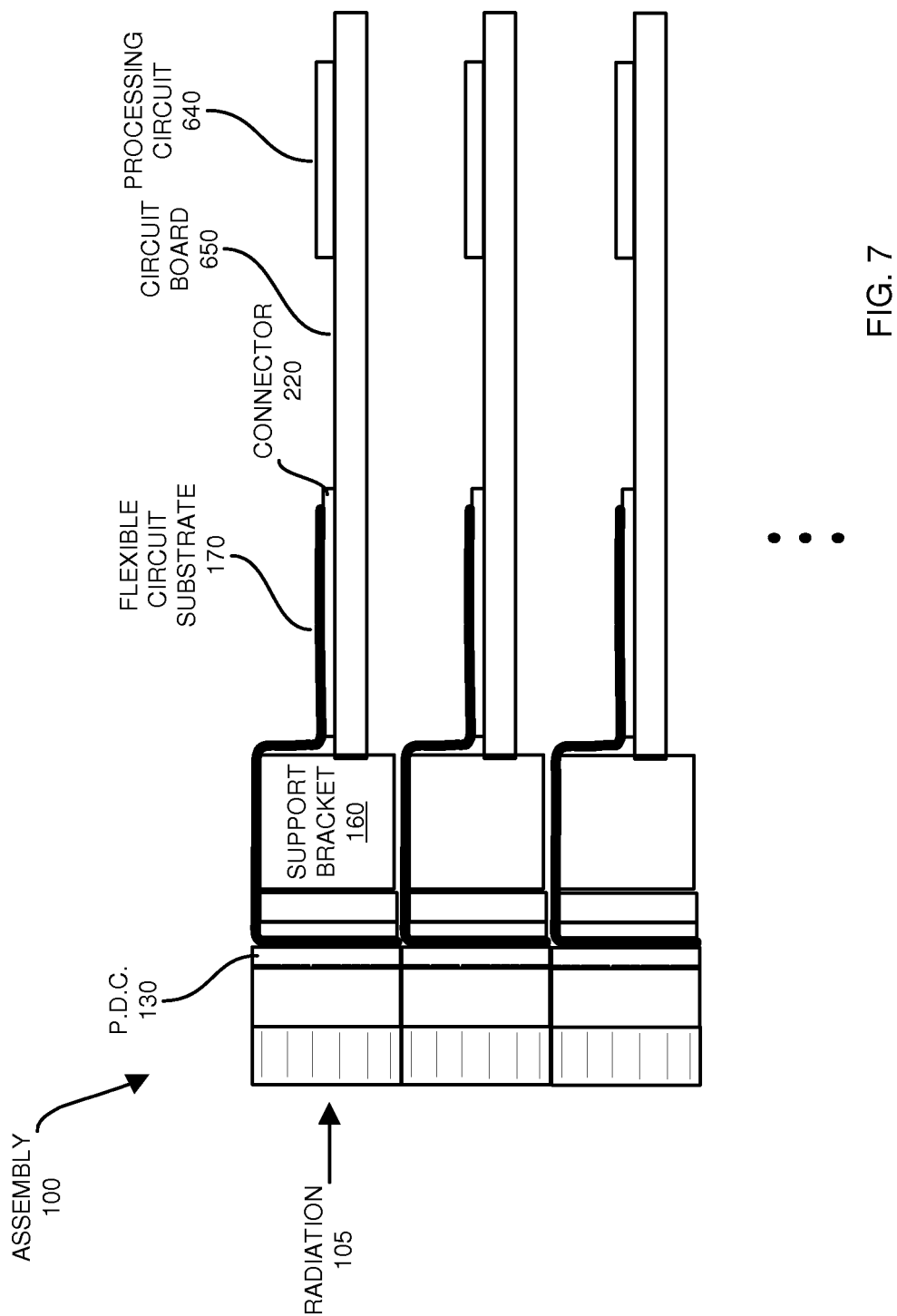
FIG. 7 is an example diagram illustrating a cross-sectional view of a photodetector assembly coupled to a circuit board according to embodiments herein.

FIG. 7 is an example diagram illustrating a cross-sectional view of a photodetector assembly coupled to a circuit board according to embodiments herein.

In one embodiment, the flexible circuit substrate 170 of assembly 100 includes one or more layers of conductive paths to electrically couple the contact nodes 175 to corresponding detection circuitry (i.e., processing circuitry) located on a circuit board 650.

As shown, a planar surface of the circuit board 650 (e.g., substrate) on which the processing circuit 640 resides is substantially orthogonal with respect to a plane of the photodetector circuit 130 (e.g., circuit substrate) on which the array of photodetectors 135 resides.

Moreover, as shown, the flexible circuit substrate 170 can include one or more bends that are each greater than 45 degrees to provide connectivity between the photodetector circuit 130 and the (remote) circuit board 650.

To facilitate connectivity between the flexible circuit substrate 170 and the circuit board 650, an intermediate connector 220 can be configured to provide connectivity of the conductive paths in the flexible circuit substrate 170 to the circuit board 650. Traces in circuit board 650 provide further connectivity to processing circuit 640. Accordingly, processing circuit receives an electrical signal produced by each of the photodetectors 135.

The assembly 100 including anti-scatter assembly 110, scintillator device 120, . . . , circuit board 650 can be duplicated and stacked as shown.

Figure 8:
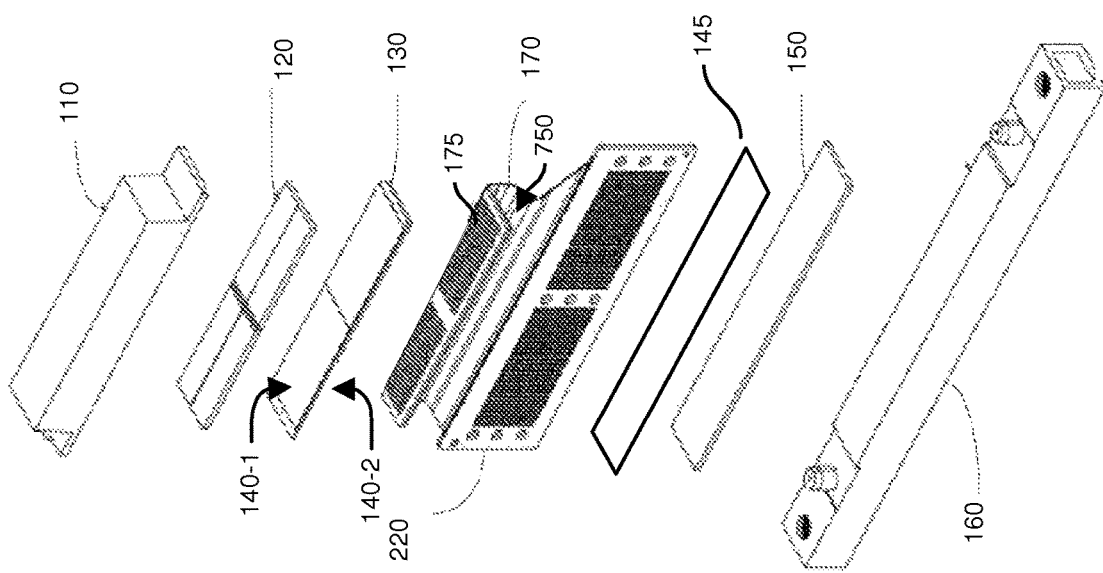
FIG. 8 is an example diagram illustrating an exploded view of a photodetector assembly according to embodiments herein.

FIG. 8 is an example diagram illustrating an exploded view of a photodetector assembly according to embodiments herein.

As previously discussed, assembly 100 includes anti-scatter assembly 110 coupled to scintillator device 120. Scintillator device 120 is sandwiched between anti-scatter assembly 110 and facing 140-1 of photodetector circuit 130. Facing 140-2 of photodetector circuit 130 couples to contact nodes 175 disposed on flexible circuit substrate 170.

A combination of substrate 145 (e.g., made from ceramic or other suitable material), shield plate 150 (e.g., made from tungsten or other suitable radiation blocking material), and bracket 160 resides in cavity 750 formed by bends in the flexible circuit substrate 170.

In one embodiment, the substrate 145 prevents the circuit board 650, processing circuit 640, etc., from being exposed to any portion of radiation 105 that is not converted into a respective optical signal via the scintillator device 120.

Figure 9:
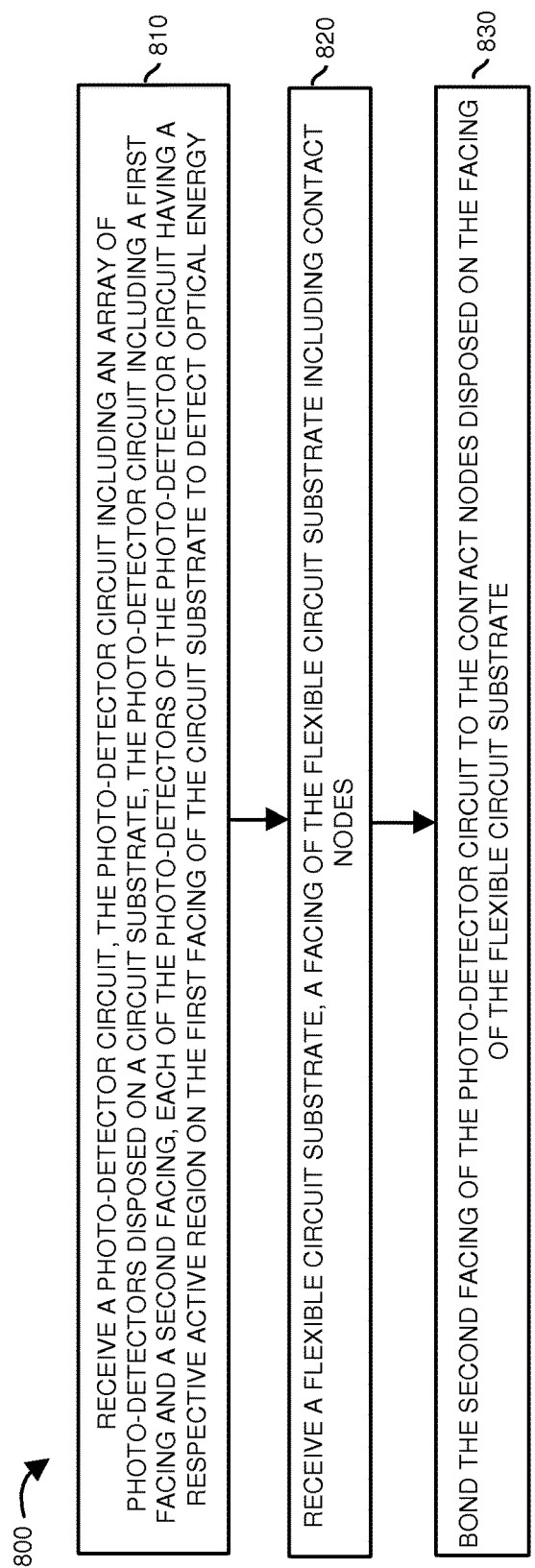
FIG. 9 is an example diagram illustrating a method of fabricating a photodetector circuit assembly according to embodiments herein.

FIG. 9 is an example flowchart 800 illustrating a method of fabricating a photodetector circuit assembly according to embodiments herein. In general, the steps can be executed in any suitable order.

In step 810, an assembler receives a photodetector circuit 130. The photodetector circuit 130 includes an array of photodetectors 135 disposed on a circuit substrate. The photodetector circuit 130 includes a first facing 140-1 and a second facing 140-2. Each of the photodetectors 135 of the photodetector circuit 135 has a respective active region on the first facing 140-1 to detect presence of optical energy produced by the scintillator device 120.

In step 820, the assembler receives a flexible circuit substrate 170. A facing of the flexible circuit substrate 170 includes contact nodes 175.

In step 830, the assembler bonds the second facing 140-2 of the photodetector circuit 130 to the contact nodes 175 disposed on the facing of the flexible circuit substrate 170.

Figure 10:
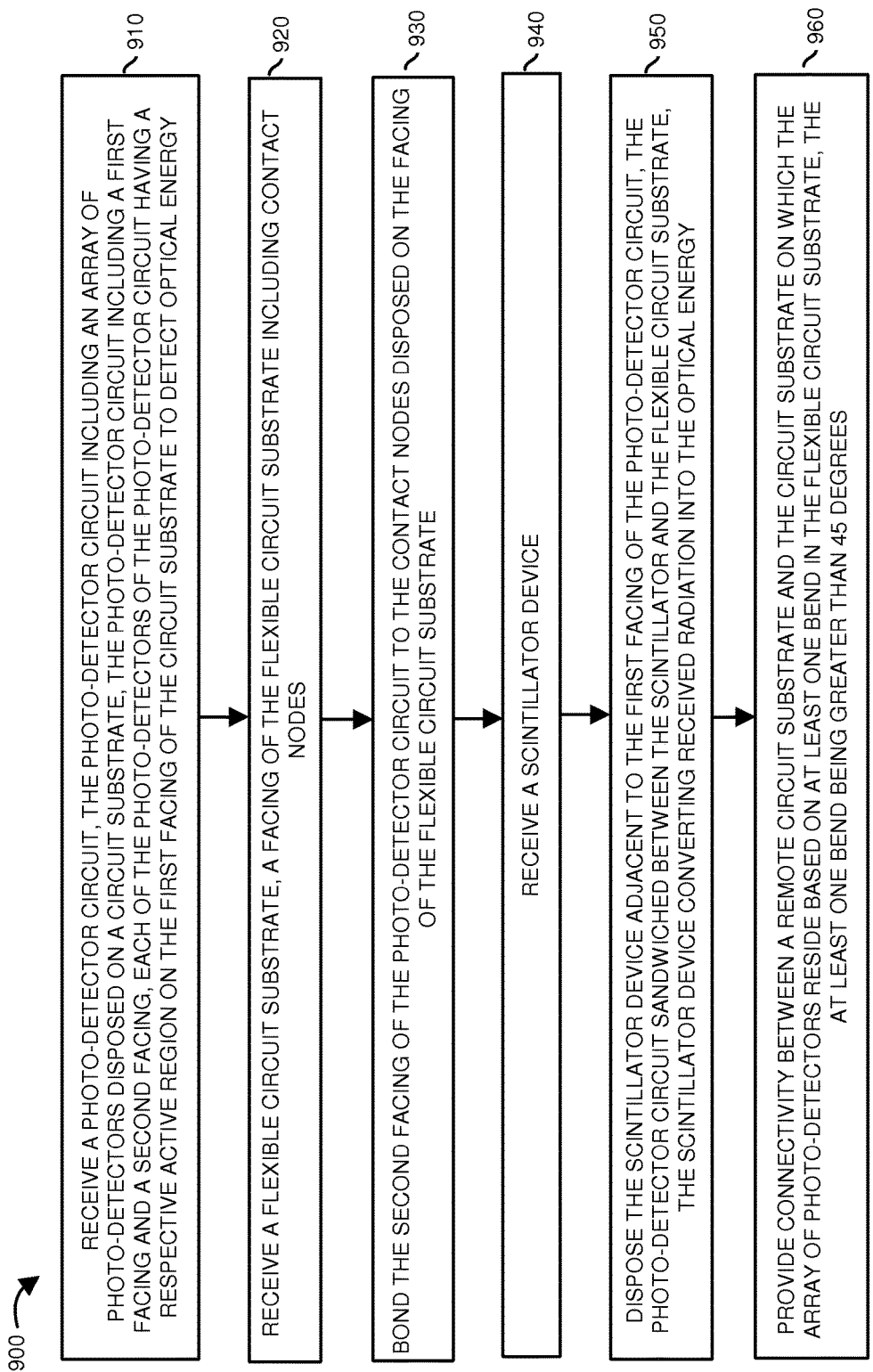
FIG. 10 is an example diagram illustrating a method of fabricating a photodetector circuit assembly including an optical detector circuit according to embodiments herein.

FIG. 10 is an example flowchart 900 illustrating a method of fabricating a photodetector circuit assembly according to embodiments herein. In general, the steps can be executed in any suitable order.

In step 910, the assembler receives a photodetector circuit 130. The photodetector circuit 130 includes an array of photodetectors 135 disposed on a respective semiconductor substrate. The photodetector circuit 130 further includes a first facing 140-1 and a second facing 140-2. Each of the photodetectors 135 of the photodetector circuit 130 has a respective active region on or near the first facing 140-1 to detect a presence of optical energy produced by the scintillator device 120.

In step 920, the assembler receives a flexible circuit substrate 170. A facing of the flexible circuit substrate 170 includes contact nodes 175.

In step 930, the assembler bonds the second facing 140-2 of the photodetector circuit 130 to the contact nodes 175 disposed on the facing of the flexible circuit substrate 170.

In step 940, the assembler receives a scintillator device 120.

In step 950, the assembler disposes the scintillator device 120 adjacent to the first facing 140-1 of the photodetector circuit 130. The photodetector circuit 130 is sandwiched between the scintillator device 120 and the flexible circuit substrate 170. The scintillator device 120 converts received radiation 105 into optical energy.

In step 960, the assembler provides connectivity between circuit board 650 (e.g., a remote circuit substrate) and the circuit substrate on which the array of photodetectors 135 resides based on one or more bends in the flexible circuit substrate 170. As previously discussed, each of the one or more bends can be greater than 45 degrees.

Figure 11:
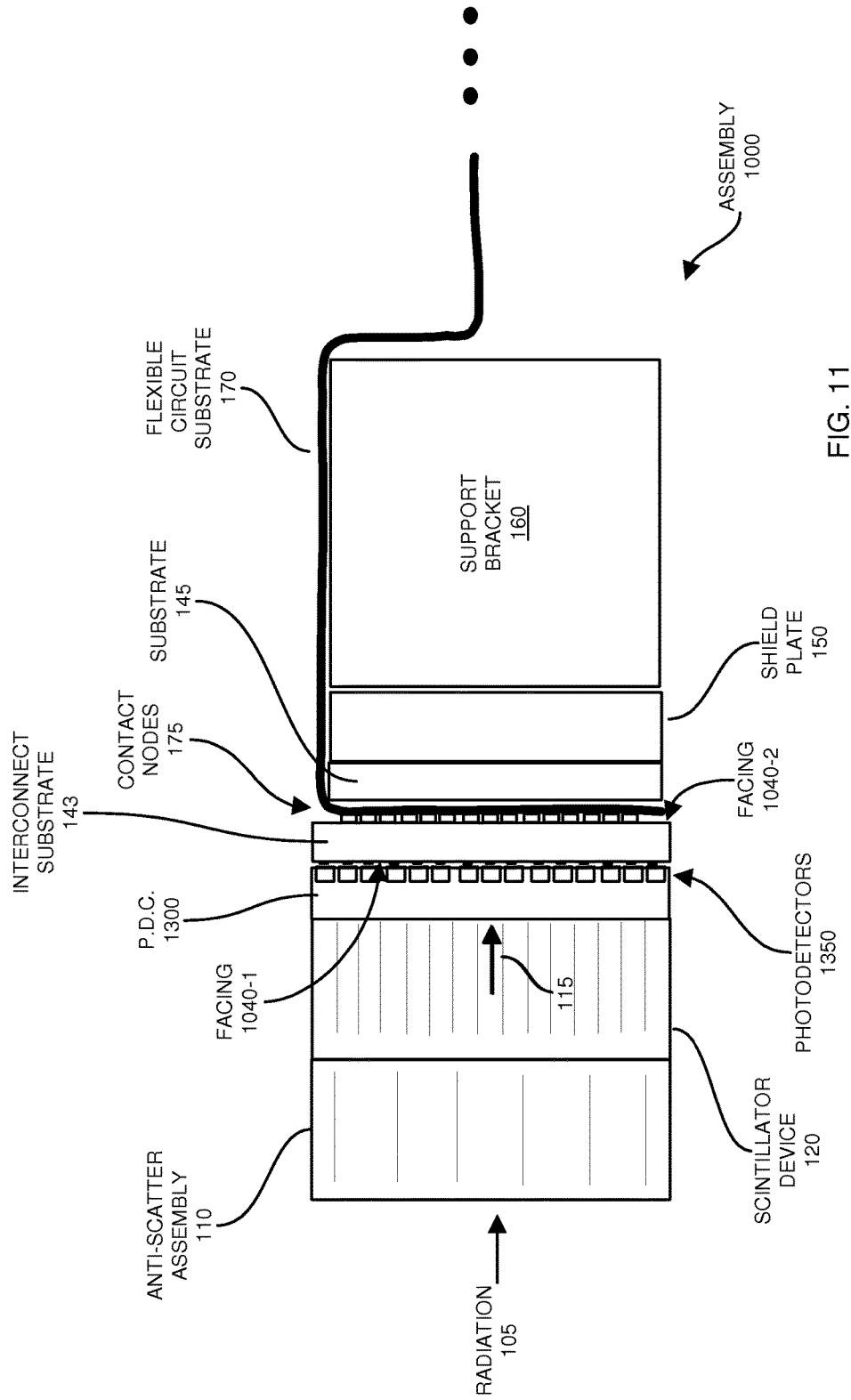
FIG. 11 is an example diagram illustrating an assembly including an interconnect substrate that provides connectivity according to embodiments herein.

FIG. 11 is an example diagram illustrating an assembly including an interconnect substrate according to embodiments herein. Assembly 1000 can be used as an alternative to use of assembly 100 in FIG. 7 to fabricate a respective radiation detection system including circuit board 650 and processing circuit 640.

As shown in FIG. 11, assembly 1000 includes anti-scatter assembly 110. In one embodiment, the anti-scatter assembly 110 reduces the amount of scattered radiation received by scintillator device 120.

At least a portion of the radiation 105 passing through the anti-scatter assembly 110 is received by scintillator device 120. By way of a non-limiting example, the scintillator device 120 can be partitioned such that pixilated portions of the scintillator device 120 align with corresponding photodetector circuits disposed on a facing of the photodetectors 135.

During scanning, the scintillator device 120 converts received radiation into a respective optical signal 115.

By way of a non-limiting example, the scintillator device 120 is disposed adjacent to and in contact with the photodetector circuit 1300. The photodetector circuit 1300 is sandwiched between the scintillator device 120 and the interconnect substrate 143.

Photodetectors 1350 reside on a surface of the photodetector circuit 1300 in contact with facing 1040-1 of the interconnect substrate 143.

By way of a non-limiting example, the photodetector circuit 1300 can include an array of so-called back illuminated photodetectors. For example, the photodetector circuit 1300 can include an array of photodetectors 1350 disposed on a corresponding circuit substrate such as a semiconductor device. The photodetector circuit 1300 includes a first facing in contact with the scintillator device 120 as previously discussed. The photodetector circuit 1300 also includes an array of photodetectors 1350 disposed on a second facing in contact with interconnect substrate 143.

By way of a non-limiting example, each of the photodetectors 1350 of the photodetector circuit 1300 has a respective active region (on the back facing of photodetector circuit 1300 in contact with the interconnect substrate 143) in which to detect a presence of optical energy produced by the scintillator device 120. By way of a non-limiting example, each of the photodetectors 1350 of the photodetector circuit 1300 receives at least a portion of the optical energy through the backside of the photodetector 1350.

Based on a received optical signal 115 in a region of coverage, each of the photodetectors 1350 produces a corresponding electrical signal representative of a degree to which the photodetector detects presence of radiation in a respective area of coverage.

As discussed in the following figures, the interconnect substrate 143 conveys electrical signals outputted from nodes on the photodetector circuit 1300 to the contact nodes 175 on flexible circuit substrate 170. In other words, for each of the photodetectors 1350, the interconnect substrate 143 includes a respective conductive path extending from facing 1040-1 to facing 1040-2 to provide connectivity between the photodetectors 1350 and contact nodes 175 on the flexible circuit substrate 170.

Flexible circuit substrate 170, in turn, conveys the electrical signals to a remote image processing circuit that reproduces an image based on the electrical signals produced by the photodetector circuit 130. The flexible circuit substrate 170 can include one or more trace layers to provide connectivity to a remote processing circuit.

In one embodiment, each of the photodetectors 1350 disposed on the photodetector circuit 1300 includes an active region. Each respective active region is a doped region including an impurity diffused during fabrication of the photodetector circuit 1300. Thus, in one embodiment, respective active regions in the photodetector circuit 1300 are semiconductor doped regions disposed on a facing of the photodetector circuit 1300 in contact with the first facing 1040-1 of the interconnect substrate 143.

In accordance with further embodiments, the first facing 1040-1 of the interconnect substrate 143 is fixedly attached to photodetector contact elements (e.g., output pads associated with the photodetectors 1350) disposed on a respective surface of the photodetector circuit 1300. The second facing 1040-2 of the interconnect substrate 143 is fixedly attached to the contact nodes 175 disposed on the flexible circuit substrate 170.

Detection of the optical signal 115 in the active region associated with a photodetector 1350 results in generation of a corresponding electrical signal indicating a degree to which radiation is present in the corresponding region of coverage.

In one embodiment, conductive paths in the interconnect substrate 143 include first terminal ends and second terminal ends. The first terminal ends of the conductive paths of the interconnect substrate 143 disposed on the first facing 1040-1 are fixedly attached to corresponding photodetector contact elements disposed on a respective surface of the photodetector circuit 1300. Second terminal ends of the conductive paths of the interconnect substrate 143 disposed on a second facing 1040-2 are fixedly attached to the contact nodes 175 disposed on the flexible circuit substrate 170.

In accordance with embodiments herein, a respective spatial density of the first terminal ends of the conductive paths per unit of area on the first facing 1040-1 is less than a spatial density of the second terminal ends of the conductive paths per unit of area on the second facing 1040-2.

Reducing a pitch between adjacent electrical nodes from facing 1040-1 to facing 1040-2 renders it possible to keep a thickness of a portion of the assembly 1000 including flexible circuit substrate 170, substrate 145, bracket 160, etc., less than width, W, as shown. In accordance with such an embodiment, the multiple circuit boards can be easily stacked such that respective photodetectors provide continuous detector coverage.

Figure 12:
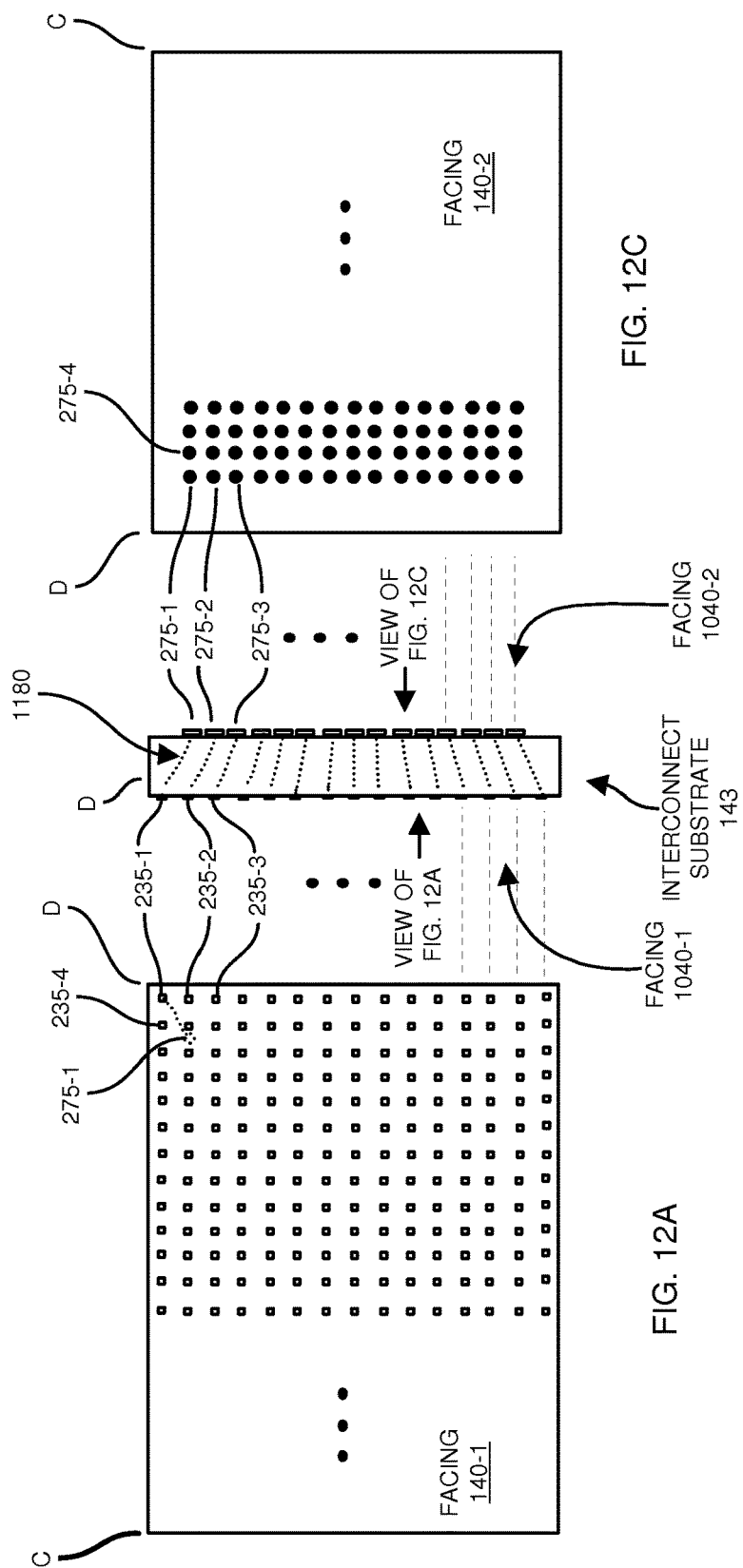
FIG. 12A is an example diagram illustrating a view of a first facing of an interconnect substrate according to embodiments herein.
FIG. 12B is an example diagram illustrating a cross-sectional view of an interconnect substrate according to embodiments herein.
FIG. 12C is an example diagram illustrating a view of a second facing of an interconnect substrate according to embodiments herein.

FIG. 12A is an example diagram illustrating a view of a first facing 1040-1 of interconnect substrate 143 according to embodiments herein.

FIG. 12B is an example diagram illustrating a cross-sectional view of interconnect substrate 143 according to embodiments herein.

FIG. 12C is an example diagram illustrating a view of a second facing 1040-2 of interconnect substrate 143 according to embodiments herein.

As shown in FIG. 12B, the interconnect substrate 143 includes contact nodes 235 disposed on facing 1040-1. For example, facing 1040-1 includes contact node 235-1, contact node 235-2, contact node 235-3, contact node 235-4, and so on.

The interconnect substrate 143 includes contact nodes 275 on facing 1040-2. For example, facing 1040-2 includes contact node 275-1, contact node 275-2, contact node 275-3, contact node 275-4, and so on.

As shown, in one embodiment, the number of contact nodes 275 per unit of area on facing 1040-2 is smaller than the number of contact nodes 235 per unit of area on facing 1040-1.

Conductive paths 1180 in interconnect substrate 143 provide connectivity between the contact nodes 235 on facing 1040-1 and contact nodes 275 on facing 1040-2.

Figure 13:
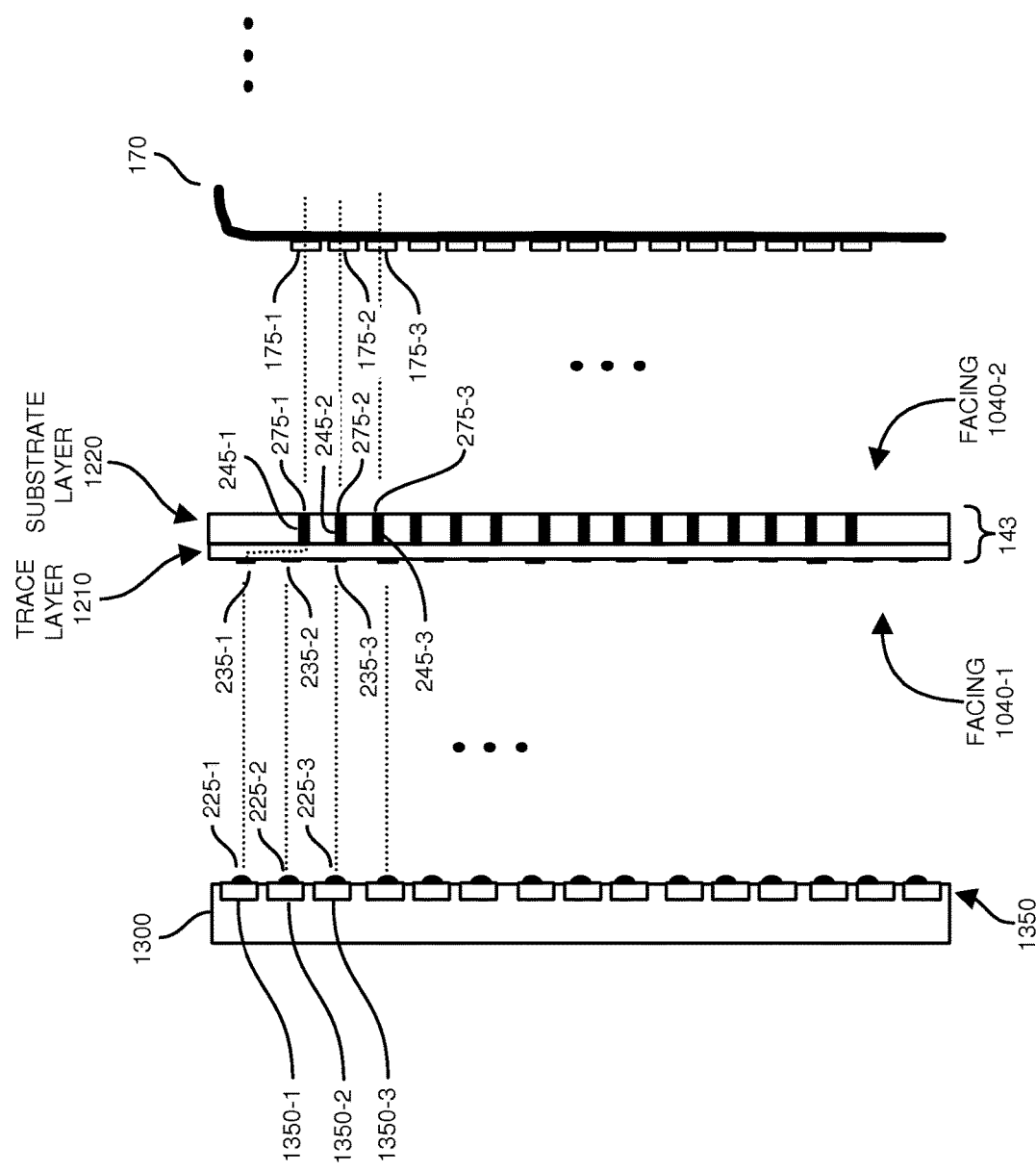
FIG. 13 is a more detailed cross-sectional view of a interconnect substrate according to embodiments herein.

FIG. 13 is a more detailed cross-sectional, exploded view of an assembly including a photodetector circuit, interconnect substrate, and flexible circuit substrate according to embodiments herein.

As shown, photodetector circuit 1300 includes multiple photodetectors 1350 on a back facing. Each photodetector includes at least one corresponding contact node 225 (e.g., an anode). For example, photodetector 1350-1 includes contact node 225-1; photodetector 1350-2 includes contact node 225-2; photodetector 1350-3 includes contact node 225-3; and so on.

As previously discussed, each of the photodetectors 1350 includes an active region in which to detect a presence of an optical signal (from scintillator device) that varies depending on how much radiation 105 is converted into the detected optical signal 115 produced by the scintillator device 120. During scanning, the optical signal is detected on the front surface of the photodetector circuit 1300, but the charge is collected in the active area of photodetector 1350. In one embodiment, the total thickness of the photodetector circuit 1300 is 0.120 millimeters in order to efficiently collect all optically created charges in the active areas of photodetector 1350. The thickness can vary depending on the embodiment.

Each of the photodetectors 1350 outputs a respective electrical signal whose magnitude varies depending on the received optical signal. For example, the photodetector 1350-1 outputs a respective electrical signal from contact node 225-1; the photodetector 1350-2 outputs a respective electrical signal from contact node 225-2; the photodetector 1350-3 outputs a respective electrical signal from contact node 225-3; and so on.

By way of a non-limiting example, interconnect substrate 143 includes contact nodes 235, a trace layer 1210, and a substrate layer 1220. The trace layer 1210 resides on facing 1040-1 substrate layer 1220 and provides connectivity between the contact nodes 235 on exposed facing 1040-1 and contact nodes 275. For example, a first conductive path extends from contact node 235-1 through trace layer 1210 to element 245-1; a second conductive path extends from contact node 235-2 through trace layer 1210 to element 245-2; a third conductive path extends from contact node 235-3 through trace layer 1210 to element 245-3; and so on. A terminal end of a respective end the elements 245 serve as contact nodes 275 expose on facing 1040-2. The traces disposed in trace layer 1210 can be metallization disposed on the surface (e.g., facing 1040-1) of the single layered ceramic substrate layer 1220. Traces can be created using thin or thick film deposition processes.

Each of the conductive paths in the trace layer 1210 can be electrically isolated from each other. Each of the elements 245 is made from electrically conductive material such as metal.

As shown, the contact nodes 225 disposed on a back facing of the photodetector circuit 1300 align with the contact nodes disposed on facing 1040-1 of the interconnect substrate 143. Thus, subsequent to assembly, after the photodetector circuit 1300 is bonded to the facing 1040-1 of the interconnect substrate 143, contact node 225-1 is electrically connected to contact node 235-1; contact node 225-2 is electrically connected to contact node 235-2; contact node 225-3 is electrically connected to contact node 235-3; and so on.

Electrical connectivity can be provided via any suitable manner such as soldering contact nodes 225 to corresponding contact nodes 235.

Further as shown, the contact nodes 275 disposed on facing 1040-2 (e.g., at terminal ends of elements 245) of the interconnect substrate 143 align with the contact nodes 175 disposed on the flexible circuit substrate 170. By way of a non-limiting example, subsequent to assembly, such as after facing 1040-2 of the interconnect substrate 143 is bonded to the flexible circuit substrate 170, contact node 275-1 (e.g., at the terminal end of element 245-1 on facing 1040-2) is electrically connected to contact node 175-1; contact node 275-2 (e.g., at the terminal end of element 245-2 on facing 1040-2) is electrically connected to contact node 175-2; contact node 275-3 (e.g., at the terminal end of element 245-3 on facing 1040-2) is electrically connected to contact node 175-3; and so on.

Electrical connectivity can be provided via any suitable manner such as soldering contact nodes 275 to corresponding contact nodes 175.

In accordance with further embodiments, substrate layer 1220 can be a single layer of any type of suitable electrically non-conductive material. Substrate layer can be rigid to reduce flexing of the photodetector circuit 1300.

In one non-limiting example embodiment, the interconnect substrate 143 includes a single layer of material such as ceramic. In other words, the substrate layer 1220 can be a ceramic substrate through which holes are drilled or etched to produce the elements 245. Trace layer 1210 provides further connectivity as previously discussed.

Each element 245 and/or contact node 275 can be made from electrically conductive material such as a copper alloy. By way of a non-limiting example, each of the elements 245 disposed in the substrate layer 1220 can be formed to any suitable shape such as a pillar, cylinder, etc.

As shown, and as previously discussed, the conductive paths such as elements 245 extending through the single layer of material (e.g., substrate layer 1220) are disposed substantially orthogonal with respect to facing 1040-2.

Portions of conductive paths in trace layer 1210 from the contact node 235 to the elements 245 can be disposed substantially orthogonal with respect to a lengthwise axis of elements 245 disposed in the substrate layer 1220. For example, in accordance with one embodiment, each of the conductive paths extending from a contact node 235 to a corresponding contact node 275 can include a first portion and a second portion. The first portions of the conductive paths extending through the interconnect substrate 143 in trace layer 1210 can reside in a plane associated with facing 1040-1. The first portions of the conductive paths include terminal ends (e.g., contact nodes 235) disposed on or near facing 1040-1; the second portions of the conductive paths can include terminal ends (e.g., contact nodes 275) disposed on facing 1040-2.

Figure 14:
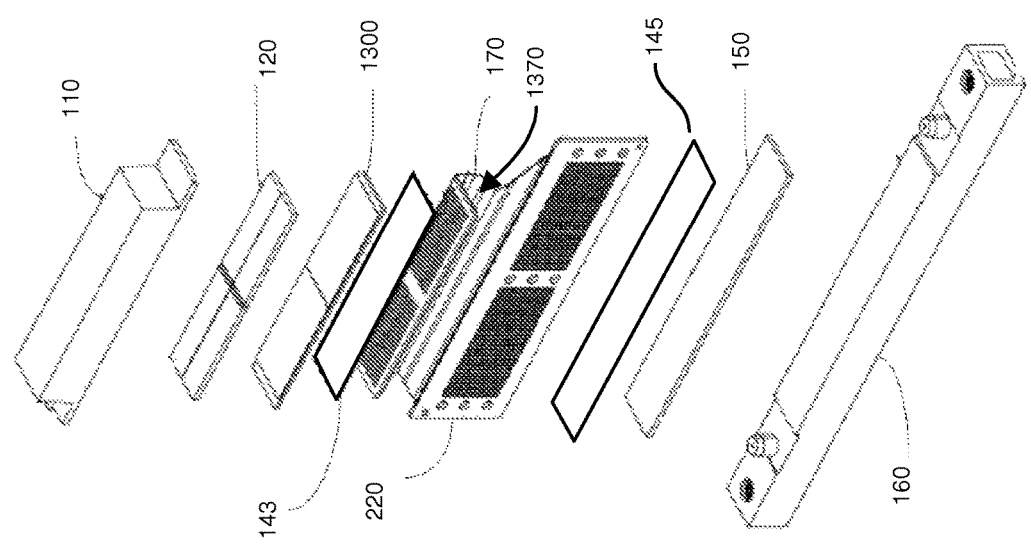
FIG. 14 is an example diagram illustrating an exploded view of a photodetector assembly according to embodiments herein.

FIG. 14 is an example diagram illustrating an exploded view of a photodetector assembly according to embodiments herein.

As previously discussed, assembly 1000 includes anti-scatter assembly 110 coupled to scintillator device 120. Scintillator device 120 is sandwiched between anti-scatter assembly 110 and photodetector circuit 1300. Interconnect substrate 143 provides connectivity between the photodetector circuit 1300 and the flexible circuit substrate 170.

A combination of substrate 145 (e.g., ceramic or other suitable material), shield plate 150 (e.g., tungsten or other suitable radiation blocking material), and bracket 160 reside in cavity 1370 formed by bends in the flexible circuit substrate 170. In one embodiment, the substrate 145 substantially prevents the circuit board 650, processing circuit 640, etc., from being exposed to any portion of radiation 105 that is not converted into a respective optical signal by the scintillator device 120. In other words, a portion of radiation 105 may pass through scintillator device 120, photodetector circuit 1300, flexible circuit substrate 170, and substrate 145. As its name suggests, shield plate 150 prevents all of a portion of the passing radiation from striking circuit board 650 or corresponding circuitry thereon.

Figure 15:
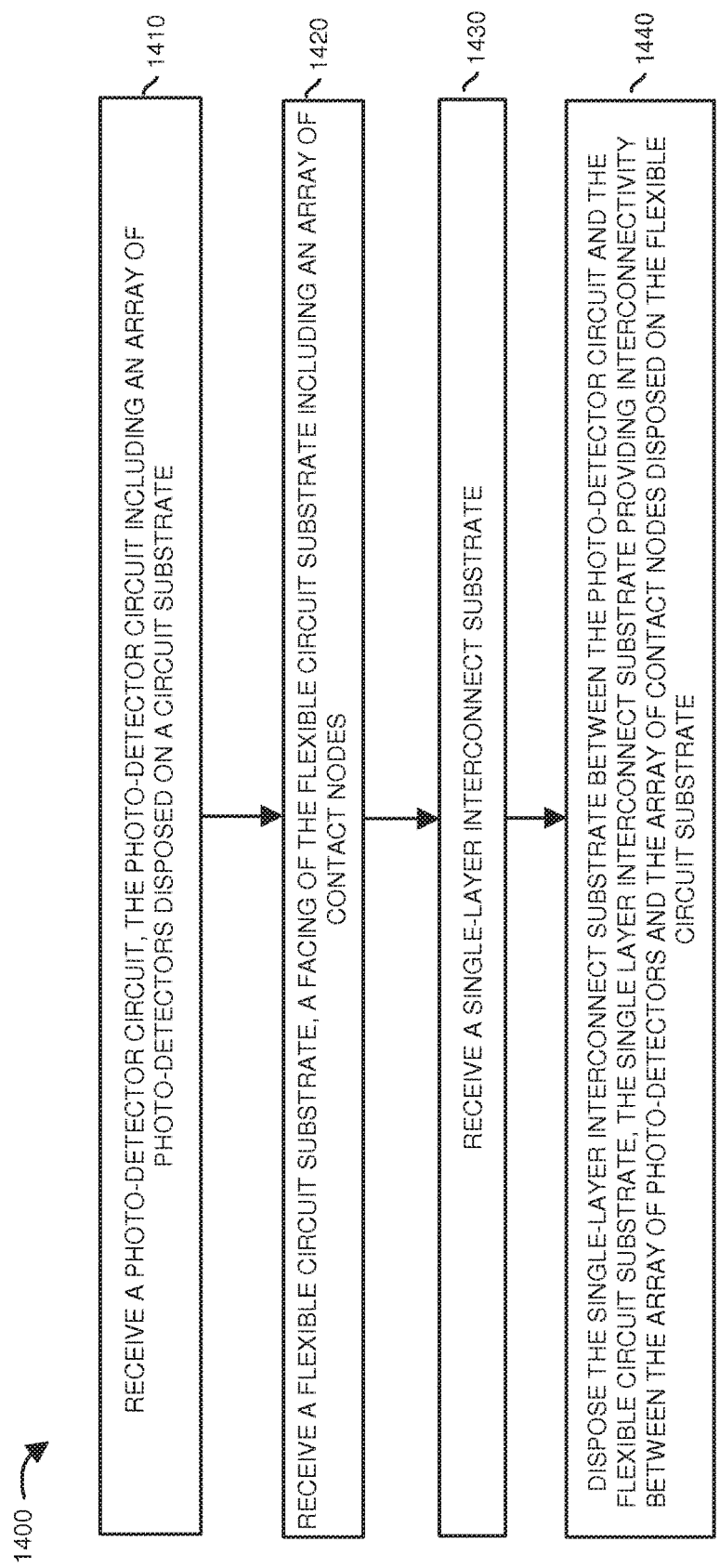
FIG. 15 is an example diagram illustrating a method of fabricating a photodetector circuit assembly according to embodiments herein.

FIG. 15 is an example diagram illustrating a method 1400 of fabricating a photodetector circuit assembly according to embodiments herein. In general, the steps can be executed in any suitable order.

In step 1410, an assembler receives a photodetector circuit 1300. The photodetector circuit 1300 includes an array of photodetectors 1350 disposed on a respective circuit substrate.

In step 1420, the assembler receives a flexible circuit substrate 170. A facing of the flexible circuit substrate 170 includes an array of contact nodes 175.

In step 1430, the assembler receives interconnect substrate 143.

In step 1440, the assembler disposes the interconnect substrate 143 between the photodetector circuit 1300 and the flexible circuit substrate 1370. The interconnect substrate 143 provides interconnectivity between the array of photodetectors 1350 and the array of contact nodes 175 disposed on the flexible circuit substrate 170.

Figure 16:
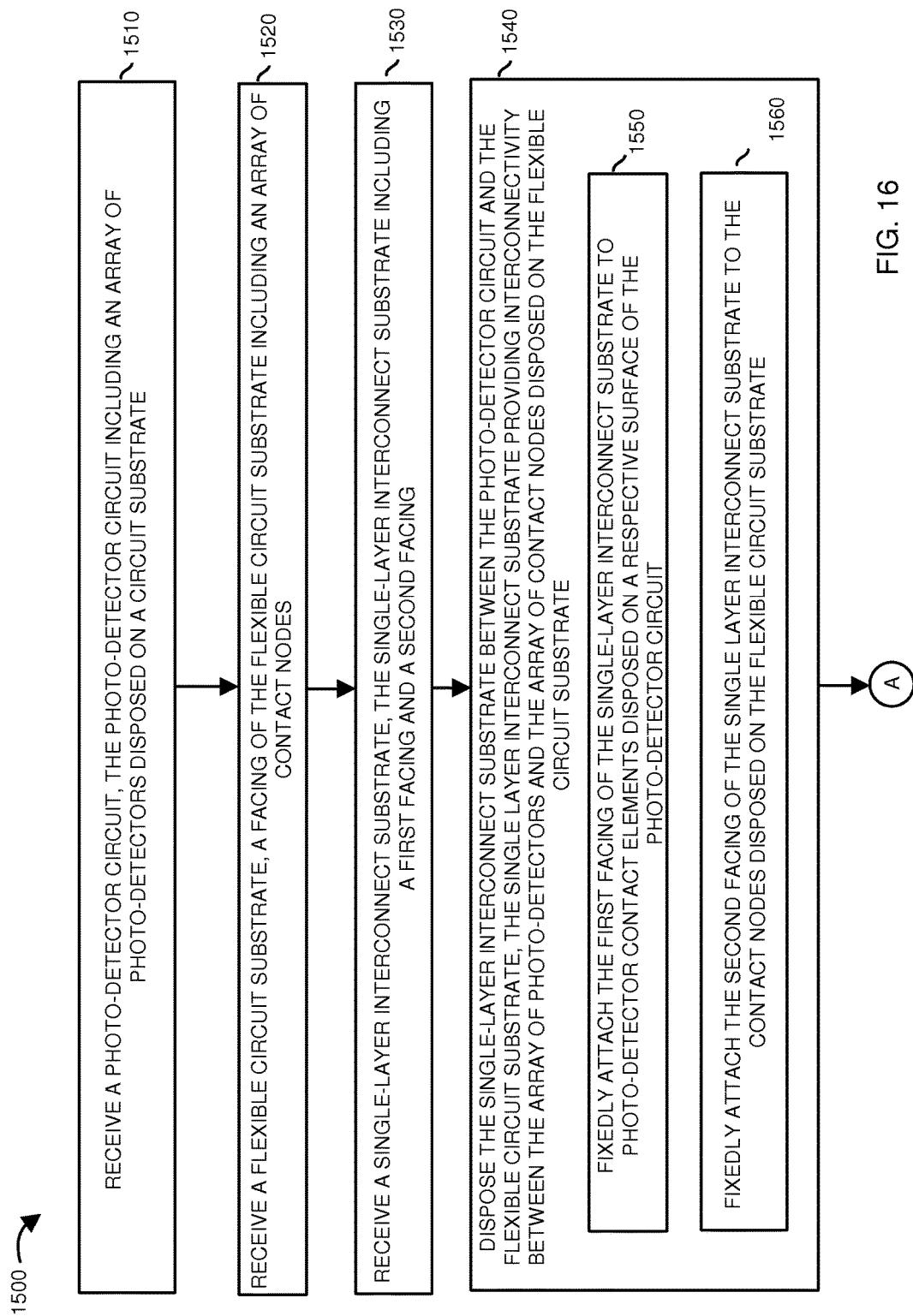
FIGS. 16 and 17 combine to form a flowchart illustrating a method of fabricating a photodetector circuit assembly according to embodiments herein.
Figure 17:
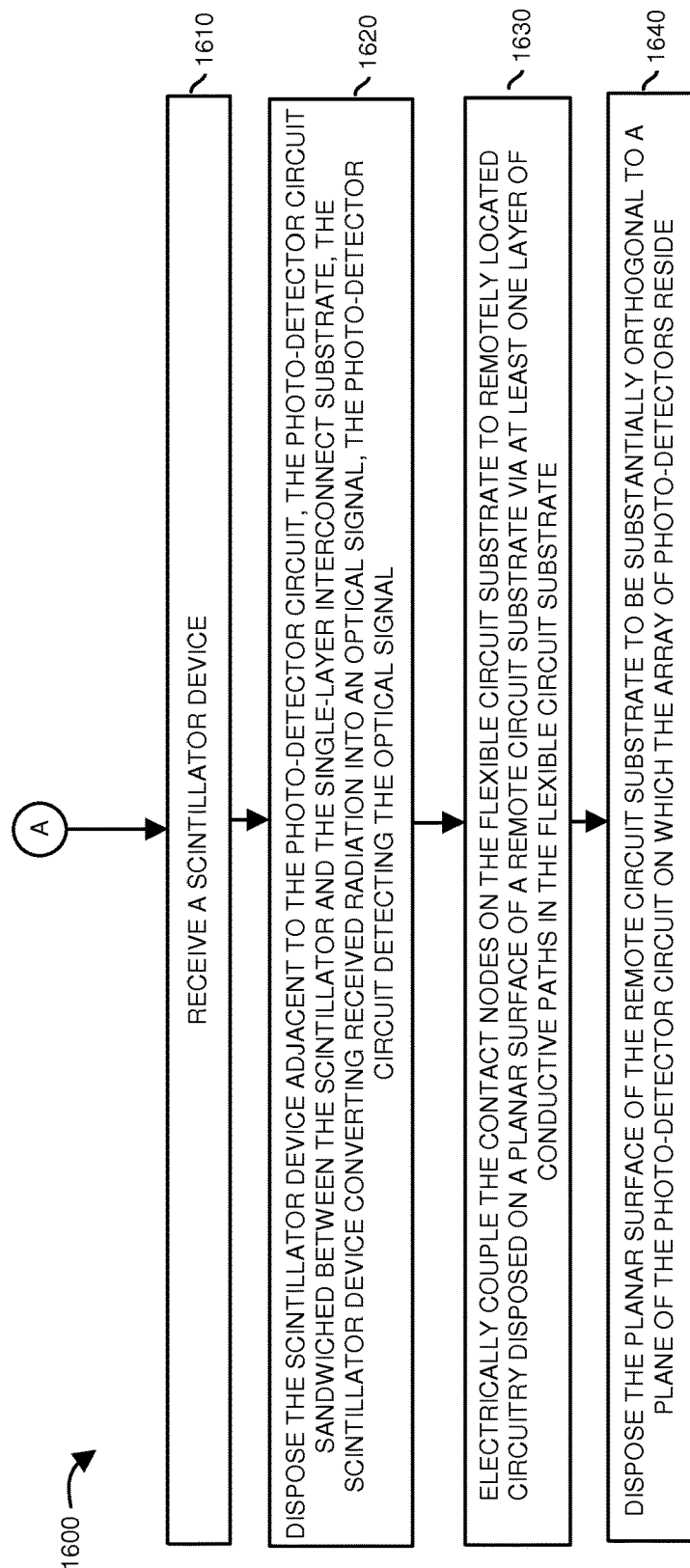

FIGS. 16 and 17 combine to form a flowchart (1500 and 1600, respectively) illustrating a method of fabricating a photodetector circuit assembly according to embodiments herein. In general, the steps can be executed in any suitable order.

In step 1510, an assembler receives a photodetector circuit 1300; the photodetector circuit 1300 includes an array of photodetectors 1350 disposed on a circuit substrate.

In step 1520, the assembler receives a flexible circuit substrate 170. A facing of the flexible circuit substrate 170 includes an array of contact nodes 175.

In step 1530, an assembler receives (a single-layer) interconnect substrate 143, the interconnect substrate 143 includes a first facing 1040-1 and a second facing 1040-2.

In step 1540, an assembler disposes the interconnect substrate 143 between the photodetector circuit 1300 and the flexible circuit substrate 170. The interconnect substrate 143 provides interconnectivity between the array of photodetectors 1350 and the array of contact nodes 175 disposed on the flexible circuit substrate 170.

In sub-step 1550, an assembler fixedly attaches the first facing 1040-1 of the interconnect substrate 143 to photodetector contact elements (e.g., contact nodes 225 disposed on a respective surface of the photodetector 1350).

In sub-step 1560, an assembler fixedly attaches the second facing 1040-2 of the interconnect substrate 143 to the contact nodes 175 disposed on the flexible circuit substrate 170.

In step 1610 of FIG. 17, an assembler receives a scintillator device 120.

In step 1620, an assembler disposes the scintillator device 120 adjacent to the photodetector circuit 1300. In one embodiment, the photodetector circuit 1300 is sandwiched between the scintillator device 120 and the interconnect substrate 143. During operation, the scintillator device 120 converts received radiation 105 into an optical signal 115. The photodetector circuit 1300 detects the optical signal 115.

In step 1630, via one or more layers of conductive paths in the flexible circuit substrate 170, an assembler electrically couples the contact nodes 175 on the flexible circuit substrate to remotely located circuitry (e.g., processing circuitry 640) disposed on circuit board 650.

In step 1640, an assembler disposes the planar surface of the remote circuit board 650 to be substantially orthogonal to a plane of the photodetector circuit 1300 on which the photodetectors 1350 reside.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A computed tomography detector, comprising:
a front-illuminated photodiode array including a first facing configured to receive optical energy indicative of X-radiation, a substrate, and a second facing including a plurality of photodiode contact nodes in electrical communication with corresponding photodiodes in the front-illuminated photodiode array; and a flexible circuit substrate, wherein:
the flexible circuit substrate includes a first facing and a second facing, the first facing of the flexible circuit substrate includes contact nodes and is substantially coextensive with the second facing of the front-illuminated photodiode array,
the second facing of the flexible circuit substrate is substantially orthogonal to the first facing of the flexible circuit substrate and is electrically coupled to a remote circuit board,
the second facing of the flexible circuit substrate underlies at least one photodiode of the front-illuminated photodiode array,
the photodiode contact nodes of the front-illuminated photodiode array are directly bonded to the contact nodes disposed on the first facing of the flexible circuit substrate,
an interface between the second facing of the flexible circuit substrate and the circuit board is substantially orthogonal to an interface between the first facing of the flexible circuit substrate and the second facing of the front-illuminated photodiode array, and
a pitch of photodiodes in the front-illuminated photodiode array is greater than a pitch of the plurality of photodiode contact nodes disposed on the second facing of the front-illuminated photodiode array.

2. The computed tomography detector as in claim 1, further comprising:
a scintillator disposed in optical communication with the first facing of the front-illuminated photodiode array, wherein:
the front-illuminated photodiode array is disposed between the scintillator and the flexible circuit substrate, and
the scintillator converts received X-radiation into the optical energy.

3. The computed tomography detector as in claim 1, wherein:
the substrate of the front-illuminated photodiode array includes multiple conductive paths extending through the substrate from photodiodes in the front-illuminated photodiode array to the second facing of the front-illuminated photodiode array, and
the conductive paths extending through the substrate provide electrical connectivity between the photodiodes and the contact nodes disposed on the first facing of the flexible circuit substrate.

4. The computed tomography detector as in claim 3, wherein:
a pitch of photodiodes in the front-illuminated photodiode array is greater than a respective pitch of the contact nodes disposed on the first facing of the flexible circuit substrate, and
the conductive paths extending through the substrate facilitate a change in pitch between the photodiode contact nodes and corresponding contact nodes disposed on the first facing of the flexible circuit substrate.

5. The computed tomography detector as in claim 1, wherein:
the flexible circuit substrate includes multiple layers of conductive paths to electrically couple the contact nodes disposed on the first facing of the flexible circuit substrate to detection circuitry located on the remote circuit board, and
a planar surface of the remote circuit board is in electrical communication with a planar surface of a processing circuit, the planar surface of the processing circuit substantially orthogonal with respect to the second facing of the front-illuminated photodiode array.

6. The computed tomography detector as in claim 1, further comprising:
a second substrate in contact with a third facing of the flexible circuit substrate diametrically opposite the first facing of the flexible circuit substrate, wherein a width of the front-illuminated photodiode array in a direction of a major surface of the second facing is greater than a width of the second substrate in the direction.

7. The computed tomography detector of claim 6, further comprising:
a shield plate in contact with the second substrate.

8. The computed tomography detector of claim 1, wherein the computed tomography detector is disposed in an array of multiple detectors.

9. A method comprising:
via a front-illuminated detection circuit in a computed tomography system, detecting energy indicative of radiation received by the front-illuminated detection circuit;
utilizing the front-illuminated detection circuit to convert the energy into electrical signals; and
transmitting the electrical signals from the front-illuminated detection circuit to a flexible circuit substrate to which the front-illuminated detection circuit is directly bonded and having a first facing that interfaces with the front-illuminated detection circuit and a second facing substantially orthogonal to the first facing, wherein the first facing extends along a width of the front-illuminated detection circuit and is substantially coextensive with the front-illuminated detection circuit, the width being in a direction of the first facing, wherein the second facing underlies at least one photodetector of the front-illuminated detection circuit and is in direct electrical communication with processing circuitry on a remote circuit substrate, wherein a planar surface of the remote circuit substrate on which the processing circuitry resides is substantially orthogonal with respect to a plane of the front-illuminated detection circuit and is located in a plane intersecting a central portion of the width, the flexible circuit substrate further comprising a U-shaped portion between the first facing and the second facing at least a support bracket located within the U-shaped portion.

10. The method as in claim 9, further comprising:
receiving the energy from a scintillator disposed in communication with the front-illuminated detection circuit, the front-illuminated detection circuit disposed between the scintillator and the flexible circuit substrate, the scintillator converting the radiation into the energy.

11. The method as in claim 9, further comprising:
transmitting the electrical signals on multiple conductive paths fabricated in a substrate of the front-illuminated detection circuit, the multiple conductive paths extending through the substrate of the front-illuminated detection circuit from photodetectors of the front-illuminated detection circuit detecting the energy to respective contact nodes disposed on the first facing of the flexible circuit substrate.

12. The method as in claim 11, wherein:
a pitch of the photodetectors of the front-illuminated detection circuit is greater than a respective pitch of the contact nodes disposed on the first facing of the flexible circuit substrate, and the multiple conductive paths are fabricated in the substrate of the front-illuminated detection circuit to facilitate a change in pitch between the photodetectors and the respective contact nodes disposed on the first facing of the flexible circuit substrate.

13. The method as in claim 9, further comprising:
conveying the electrical signals on the flexible circuit substrate, wherein:
the flexible circuit substrate includes multiple layers of conductive paths to electrically couple the front-illuminated detection circuit to the processing circuitry located on the remote circuit substrate.

14. An assembly, comprising:
a photodetector circuit including an array of photodetectors disposed on a circuit substrate to receive optical energy indicative of radiation received by the array of photodetectors of a computed tomography apparatus;
a flexible circuit substrate, wherein:
the flexible circuit substrate includes a first facing and a second facing, the first facing of the flexible circuit substrate includes an array of contact nodes in electrical communication with the array of photodetectors and extends along a width of the array of photodetectors, the first facing of the flexible circuit substrate substantially coextensive with the array of photodetectors, the second facing of the flexible circuit substrate operably coupled to a circuit board, the width being in a direction of the first facing of the flexible circuit substrate,
the second facing of the flexible circuit substrate is substantially orthogonal to the first facing of the flexible circuit substrate, and
the second facing of the flexible circuit substrate underlies at least one photodetector of the array of photodetectors and is in electrical communication with processing circuitry in a plane intersecting a substantially central portion of the width.

15. The assembly as in claim 14, further comprising:
an interconnect substrate including a first facing and a second facing, wherein:
the first facing of the interconnect substrate is in contact with the photodetector circuit,
the second facing of the interconnect substrate is in contact with the array of contact nodes,
the interconnect substrate includes conductive paths extending from the first facing of the interconnect substrate to the second facing of the interconnect substrate to provide interconnectivity between the array of photodetectors and the array of contact nodes, and
at least a portion of each of the conductive paths is disposed substantially orthogonal with respect to both the first facing of the interconnect substrate and the second facing of the interconnect substrate.

16. The assembly as in claim 15, wherein:
the first facing of the interconnect substrate is fixedly attached to photodetector contact elements disposed on a surface of the photodetector circuit, and
the second facing of the interconnect substrate is fixedly attached to contact nodes of the array of contact nodes.

17. The assembly as in claim 15, wherein the interconnect substrate of material is a single layer of ceramic.

18. The assembly as in claim 14, wherein:
the photodetector circuit includes a plurality of active regions,
respective active regions in the photodetector circuit are semiconductor doped regions, and
the semiconductor doped regions are disposed in the photodetector circuit adjacent a facing of the photodetector circuit in contact with the first facing of the interconnect substrate.

19. The assembly as in claim 14, wherein the array of photodetectors include back-illuminated photodetectors.

20. The assembly as in claim 14, further comprising:
a third substrate in contact with a third facing of the flexible circuit substrate diametrically opposite the first facing of the flexible circuit substrate, wherein the second facing of the flexible circuit substrate is in contact with a sidewall of the third substrate.

21. The assembly as in claim 14, further comprising a support bracket coupled to the flexible circuit substrate between the first facing of the flexible circuit substrate and the second facing of the flexible circuit substrate.

22. The assembly as in claim 14, wherein the flexible circuit substrate forms a U-shaped cavity, a shield plate and a bracket located within the cavity.

23. The computed tomography detector as in claim 1, wherein the substrate of the front-illuminated photodiode array includes multiple conductive paths extending through the substrate from photodiodes in the front-illuminated photodiode array to the second facing of the front-illuminated photodiode array, at least one conductive path having a first portion extending orthogonal with respect to a plane of the first facing of the front-illuminated photodiode array and a second portion extending in a direction substantially parallel with the plane of the first facing of the front-illuminated photodiode array.

* * * * *